(12) United States Patent
Suzawa et al.

(10) Patent No.: US 8,003,483 B2
(45) Date of Patent: Aug. 23, 2011

(54) METHOD FOR MANUFACTURING SOI SUBSTRATE

(75) Inventors: Hideomi Suzawa, Atsugi (JP); Shinya Sasagawa, Chigasaki (JP); Akihisa Shimomura, Atsugi (JP); Junpei Momo, Sagamihara (JP); Motomu Kurata, Atsugi (JP); Taiga Muraoka, Atsugi (JP); Kosei Nei, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 26 days.

(21) Appl. No.: 12/399,047

(22) Filed: Mar. 6, 2009

(65) Prior Publication Data

US 2009/0239354 A1  Sep. 24, 2009

(30) Foreign Application Priority Data

Mar. 18, 2008  (JP) ................... 2008-070474

(51) Int. Cl.
  *H01L 21/76* (2006.01)
(52) U.S. Cl. ................ 438/406; 438/458; 257/E21.568; 257/E21.122
(58) Field of Classification Search .................. 438/465, 438/404, 463, 799, 406, 458; 257/E21.121, 257/E21.122, E21.088, E21.085, E21.087, 257/E21.568
See application file for complete search history.

(56) References Cited

U.S. PATENT DOCUMENTS

| | | | |
|---|---|---|---|
| 5,374,564 A | 12/1994 | Bruel | |
| 6,127,702 A | 10/2000 | Yamazaki et al. | |
| 6,143,628 A * | 11/2000 | Sato et al. | 438/455 |
| 6,191,007 B1 | 2/2001 | Matsui et al. | |
| 6,251,754 B1 | 6/2001 | Ohshima et al. | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,468,923 B1 | 10/2002 | Yonehara et al. | |
| 6,534,380 B1 | 3/2003 | Yamauchi et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,855,584 B2 | 2/2005 | Yamazaki et al. | |

(Continued)

FOREIGN PATENT DOCUMENTS

EP  1 039 513  9/2000

(Continued)

*Primary Examiner* — Caridad M Everhart
(74) *Attorney, Agent, or Firm* — Eric J. Robinson; Robinson Intellectual Property Law Office, P.C.

(57) ABSTRACT

Forming an insulating film on a surface of the single crystal semiconductor substrate, forming a fragile region in the single crystal semiconductor substrate by irradiating the single crystal semiconductor substrate with an ion beam through the insulating film, forming a bonding layer over the insulating film, bonding a supporting substrate to the single crystal semiconductor substrate by interposing the bonding layer between the supporting substrate and the single crystal semiconductor substrate, dividing the single crystal semiconductor substrate at the fragile region to separate the single crystal semiconductor substrate into a single crystal semiconductor layer attached to the supporting substrate, performing first dry etching treatment on a part of the fragile region remaining on the single crystal semiconductor layer, performing second dry etching treatment on a surface of the single crystal semiconductor layer subjected to the first etching treatment, and irradiating the single crystal semiconductor layer with laser light.

11 Claims, 12 Drawing Sheets

U.S. PATENT DOCUMENTS

| | | |
|---|---|---|
| 6,875,633 B2 | 4/2005 | Fukunaga |
| 6,884,694 B2 | 4/2005 | Park et al. |
| 7,015,083 B2 | 3/2006 | Yamazaki et al. |
| 7,119,365 B2 | 10/2006 | Takafuji et al. |
| 7,176,525 B2 | 2/2007 | Fukunaga |
| 7,199,024 B2 | 4/2007 | Yamazaki |
| 7,256,776 B2 | 8/2007 | Yamazaki et al. |
| 7,291,523 B2 | 11/2007 | Yamazaki et al. |
| 7,338,882 B2 | 3/2008 | Park et al. |
| 7,354,844 B2 | 4/2008 | Endo et al. |
| 7,364,984 B2 | 4/2008 | Endo et al. |
| 7,416,960 B2 | 8/2008 | Endo et al. |
| 2001/0019877 A1 | 9/2001 | Miyake et al. |
| 2002/0070454 A1 | 6/2002 | Yasukawa |
| 2004/0061176 A1 | 4/2004 | Takafuji et al. |
| 2004/0104424 A1 | 6/2004 | Yamazaki |
| 2005/0009252 A1 | 1/2005 | Yamazaki et al. |
| 2005/0014346 A1* | 1/2005 | Mitani et al. ............ 438/459 |
| 2006/0035440 A1* | 2/2006 | Ghyselen et al. ............ 438/458 |
| 2007/0063281 A1 | 3/2007 | Takafuji et al. |
| 2007/0093039 A1* | 4/2007 | Kerdiles et al. ............ 438/460 |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0232025 A1* | 10/2007 | Moriceau et al. ............ 438/458 |
| 2007/0281172 A1* | 12/2007 | Couillard et al. ............ 428/446 |
| 2007/0291022 A1 | 12/2007 | Yamazaki et al. |
| 2008/0138963 A1 | 6/2008 | Yamazaki et al. |
| 2008/0268263 A1 | 10/2008 | Yamazaki |
| 2008/0286937 A1* | 11/2008 | Mitani ............ 438/458 |
| 2009/0075456 A1 | 3/2009 | Akimoto et al. |
| 2009/0098704 A1 | 4/2009 | Ohnuma et al. |

FOREIGN PATENT DOCUMENTS

| | | |
|---|---|---|
| EP | 1 045 448 | 10/2000 |
| EP | 1 688 990 | 8/2006 |
| JP | 02-054532 A | 2/1990 |
| JP | 11-097379 | 4/1999 |
| JP | 11-163363 | 6/1999 |
| JP | 2000-124092 | 4/2000 |
| JP | 2000-349266 | 12/2000 |
| JP | 2003-173968 | 6/2003 |
| JP | 2004-080035 | 3/2004 |
| JP | 2004-087606 | 3/2004 |
| JP | 2005-203596 | 7/2005 |
| JP | 2005-252244 | 9/2005 |
| JP | 2006-216807 | 8/2006 |

\* cited by examiner

METHOD FOR MANUFACTURING SOI SUBSTRATE

BACKGROUND OF THE INVENTION

1. Field of the Invention

The present invention relates to a method for manufacturing an SOI substrate having a so-called silicon-on-insulator (SOI) structure in which a single crystal semiconductor layer is provided on an insulating surface, and a method for manufacturing a semiconductor device having the SOI structure.

2. Description of the Related Art

Integrated circuits in which an SOI substrate called a silicon-on-insulator (hereinafter also referred to as "SOI") having a thin single crystal semiconductor layer on an insulating surface is used instead of a silicon wafer which is manufactured by thinly slicing a single crystal semiconductor ingot have been developed. The integrated circuits using the SOI substrate have been attracting attention due to their reduced parasitic capacitance between a drain of a transistor and a substrate, which will lead to an improvement of semiconductor integrated circuits.

As a method for manufacturing an SOI substrate, a hydrogen ion implantation separation method is known (for example, see Patent Document 1: Japanese Published Patent Application No. 2000-124092). The hydrogen ion implantation separation method is a method by which hydrogen ions are implanted into a silicon wafer to form a fragile region at a predetermined depth from the surface, and a thin silicon layer is bonded to another silicon wafer using the fragile region as a cleavage plane. In addition to the heat treatment for separation of the silicon layer, it is necessary to perform heat treatment in an oxidizing atmosphere to form an oxide film on the silicon layer, remove the oxide film, and perform heat treatment at 1000° C. to 1300° C. to increase bonding strength.

On the other hand, a semiconductor device in which an insulating substrate such as high heat resistant glass is provided with a silicon layer is disclosed (for example, see Patent Document 2: Japanese Published Patent Application No. H11-163363). In this semiconductor device, a silicon layer obtained by a hydrogen ion implantation separation method is attached to a supporting substrate which is formed of a crystallized glass having a distortion point of 750° C. or higher.

SUMMARY OF THE INVENTION

However, due to an ion implantation step for forming the fragile region and a separation step, crystal defects remain on a surface of and in the silicon layer, and the planarity of the surface deteriorates. In addition, there are problems such as a rough surface, variation in thickness, and minute chinks of the single crystal silicon layer if smooth cleavage for releasing the single crystal silicon layer is not conducted.

Removal of crystal defects of the semiconductor layer which is attached to a silicon wafer has been conventionally achieved by heating at a temperature of 1000° C. or higher; however, such a high temperature process cannot be utilized for removal of crystal defects of a semiconductor layer that is attached to a glass substrate having a strain point of 700° C. or lower. That is, a conventional method has not been established by which the crystallinity of the single crystal semiconductor layer that is attached to the glass substrate having a strain point of 700° C. or lower is recovered to be the same level as or substantially the same level as that of a single crystal semiconductor substrate before being processed.

Meanwhile, it is necessary to suppress unevenness of the surface of the silicon layer in order to form a high-performance semiconductor element. This is because in the case of manufacturing a transistor using an SOI substrate, a gate electrode is formed over a silicon layer with a gate insulating film interposed therebetween; therefore, if there is large unevenness on the silicon layer surface, a gate insulating film with high withstand voltage is difficult to be formed. In addition, a thin gate insulating film is needed for higher withstand voltage, but if surface unevenness of the silicon layer is large, increase of interface state density with the gate insulating layer or the like causes deterioration of performance of the semiconductor element, such as decrease in field effect mobility, or increase in threshold voltage. Further, defects in the silicon layer may lead to deterioration in electrical characteristics of the semiconductor element. As described above, when a substrate having a low upper temperature limit such as a glass substrate is used as the support substrate, heat treatment at 1000° C. or higher cannot be performed; therefore, damage to the silicon layer due to the above-described ion implantation step is difficult to be sufficiently repaired.

In view of the foregoing problems, an object is to provide a method for manufacturing an SOI substrate provided with a single crystal semiconductor layer which can be used practically even when a substrate with a low upper temperature limit, such as a glass substrate, is used. In addition, another object is to manufacture a highly reliable semiconductor device which uses such an SOI substrate.

In a method for manufacturing an SOI substrate according to the present invention, a single crystal semiconductor substrate is cleaved and separated into a single crystal semiconductor layer which is attached to a supporting substrate and a single crystal semiconductor substrate, a surface of the single crystal semiconductor layer attached to the supporting substrate is subjected to first etching treatment and second etching treatment, and then irradiated with laser light. Hereinafter, specific structures of the present invention are described.

One mode of a method for manufacturing an SOI substrate according to the present invention includes forming an insulating film on a surface of a single crystal semiconductor substrate, forming a fragile region in the single crystal semiconductor substrate by irradiating the single crystal semiconductor substrate with an ion beam through the insulating film, forming a bonding layer over the insulating film, bonding a supporting substrate to the single crystal semiconductor substrate by interposing the bonding layer between the supporting substrate and the single crystal semiconductor substrate, dividing the single crystal semiconductor substrate along the fragile region to separate the single crystal semiconductor substrate into a single crystal semiconductor layer attached to the supporting substrate and a part of the single crystal semiconductor substrate, performing first dry etching treatment on a part of the fragile region remaining on the single crystal semiconductor layer, performing second dry etching treatment on a surface of the single crystal semiconductor layer subjected to the first etching treatment, and irradiating the single crystal semiconductor layer with laser light.

One mode of a method for manufacturing an SOI substrate according to the present invention includes an insulating film on a surface of the single crystal semiconductor substrate, forming a fragile region in the single crystal semiconductor substrate by irradiating the single crystal semiconductor substrate with an ion beam through the insulating film, forming a bonding layer over the insulating film, bonding a supporting substrate to the single crystal semiconductor substrate by interposing the bonding layer between the supporting substrate and the single crystal semiconductor substrate, dividing the single crystal semiconductor substrate along the fragile region to separate the single crystal semiconductor substrate into a single crystal semiconductor layer attached to the supporting substrate and a part of the single crystal semiconductor substrate, removing a part of the fragile region remaining on the single crystal semiconductor layer by first dry etching treatment, removing an oxide film formed on a surface of the single crystal semiconductor layer by second etching treatment, and irradiating the single crystal semiconductor layer from which the oxide film is removed with laser light.

The first etching treatment and the second etching treatment can be performed by dry etching.

In this specification, "single crystal" refers to a crystal whose crystal faces or crystal axes are aligned and whose atoms or molecules are spatially ordered. Note that, although a single crystal is structured by orderly aligned atoms, a single crystal may include a lattice defect in which the alignment is partially disordered or a single crystal may include intended or unintended lattice distortion.

In this specification, a fragile region is a weakened region of a single crystal semiconductor substrate which is formed by irradiating the single crystal semiconductor substrate with an ion beam so that crystal defects by ions are formed. This fragile region is divided by generation of a crack or the like by heat treatment, so that a single crystal semiconductor layer can be separated from the single crystal semiconductor substrate.

Note that in this specification, semiconductor devices refer devices in general which can function by utilizing semiconductor characteristics. Display devices, semiconductor devices, electronic devices, and the like are all referred to as semiconductor devices.

Note that in this specification, display devices refer to liquid crystal display devices and light-emitting display devices. A liquid crystal display device includes a liquid crystal element and a light-emitting display device includes a light-emitting element. A light-emitting element includes, in its category, an element whose luminance is controlled by current or voltage. Specifically, a light-emitting element refers to an inorganic electroluminescent (EL) element, an organic EL element, and the like.

A single crystal semiconductor substrate is cleaved along a fragile region, and a single crystal semiconductor layer attached to a supporting substrate is subjected to first etching treatment and second etching treatment to remove defects and damage of a surface of the single crystal semiconductor layer and to reduce surface roughness of the single crystal semiconductor layer, and then, irradiated with laser light. Thus, defects or damage can be prevented from occurring in the single crystal semiconductor layer at the time of melting the single crystal semiconductor layer by the laser light irradiation. Accordingly, a single crystal semiconductor layer with reduced crystal defects and high planarity can be obtained.

Further, an SOI substrate provided with a single crystal semiconductor layer which is sufficient for practical use can be manufactured even in the case of using a substrate with a low upper temperature limit such as a glass substrate. Furthermore, with use of a single crystal semiconductor layer provided for such an SOI substrate, a semiconductor device including various semiconductor elements, memory elements, integrated circuits, and the like with high performance and high reliability can be manufactured with high yield.

DETAILED DESCRIPTION OF THE INVENTION

Figure 1A:
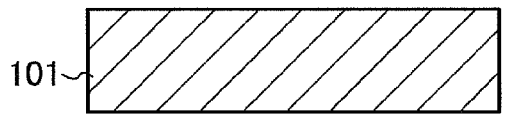
FIGS. 1A to 1G illustrate a method for manufacturing an SOI substrate of Embodiment 1.

Embodiments of the present invention will be described in detail with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below. Note that in a structure of the present invention described below, like portions or portions having like functions in different drawings are denoted by the like reference numerals and repeated description thereof is omitted.

Embodiment 1

A method for manufacturing an SOI substrate will now be described with reference to drawings in this embodiment. In the method, a single crystal semiconductor substrate is cleaved to be separated into a single crystal semiconductor layer which is attached to a supporting substrate and a single crystal semiconductor substrate, and a surface of the single crystal semiconductor layer which is attached to the supporting substrate is subjected to first etching treatment and second etching treatment, and then irradiated with laser light. Further, this embodiment also describes a method for manufacturing an SOI substrate, an object of which is to provide a single crystal semiconductor layer for a substrate with a low upper temperature limit, such as a glass substrate.

First, a single crystal semiconductor substrate 101 is prepared (see FIG. 1A). The single crystal semiconductor substrate 101 is processed into a desired size and shape. The single crystal semiconductor substrate 101 is, for example, a single crystal silicon substrate, a germanium substrate, or a compound semiconductor substrate such as a gallium arsenide substrate or an indium phosphide substrate. A commercial silicon substrate typically has a circular shape and a size of 5 inches (125 mm) in diameter, 6 inches (150 mm) in diameter, 8 inches (200 mm) in diameter, or 12 inches (300 mm) in diameter. Further, a circular substrate which is 18 inches (450 mm) in diameter can be used. Note that the shape is not limited to a circular shape and a silicon substrate which is processed into a rectangle shape can be used. Hereinafter, a case in which a single crystal silicon substrate is used as the single crystal semiconductor substrate 101 is described.

Figure 1E:
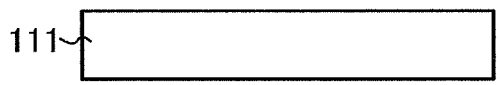
Figure 1B:
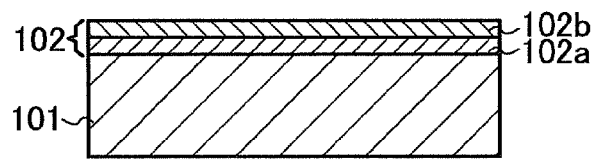

An insulating film 102 is formed over one surface of the single crystal semiconductor substrate 101 (see FIG. 1B). The insulating film 102 can have a single layer structure or a multilayer structure including two or more layers. The thickness of the insulating film 102 can be 5 nm to 400 nm, inclusive. As a film which is used for the insulating film 102, a film containing silicon or germanium as its component can be used; for example, a silicon oxide film, a silicon nitride film, a silicon oxynitride film, a silicon nitride oxide film, a germanium oxide film, a germanium nitride film, a germanium oxynitride film, or a germanium nitride oxide film can be used. Alternatively, an insulating layer made of metal oxide such as aluminum oxide, tantalum oxide, or hafnium oxide; an insulating layer made of metal nitride such as aluminum nitride; an insulating layer made of metal oxynitride such as an aluminum oxynitride film; or an insulating layer made of nitride oxide such as an aluminum nitride oxide film, can be used.

The insulating film used for the insulating film 102 is formed by a chemical vapor deposition (CVD) method, a sputtering method, or an atomic layer epitaxy (ALE) method, or by oxidizing or nitriding the single crystal semiconductor substrate 101. As a CVD method, there are a low-pressure CVD method, a thermal CVD method, a plasma-enhanced CVD method (hereinafter referred to as a PECVD method), and the like. A PECVD method is preferable because it is low-temperature treatment at 350° C. or lower and has a higher deposition rate than other CVD methods.

In a case where a substrate containing impurities such as an alkali metal or an alkaline earth metal which may reduce reliability of a semiconductor device (typically, a glass substrate) is used as the supporting substrate 111, the impurities might diffuse into a single crystal semiconductor layer 112 from the supporting substrate 111 when the supporting substrate 111 is heated. Therefore, at least one insulating film serving as a barrier layer which prevents the entry of the impurities into the single crystal semiconductor layer 112 is preferably used for the insulating film 102. The barrier layer may include one layer or two or more layers. By forming the barrier layer, such impurities that may reduce the reliability of a semiconductor device can be prevented from moving to the single crystal semiconductor layer 112. As the film that serves as a barrier layer, a silicon nitride film, a silicon nitride oxide film, an aluminum nitride film, an aluminum nitride oxide film, or the like is given. By provision of such a film, the insulating film 102 can serve as a barrier layer.

For example, in a case of forming the insulating film 102 with a single-layer structure, a film serving as a barrier layer is formed as the insulating film 102. In that case, the insulating film 102 with a single-layer structure can be formed of a silicon nitride film, a silicon nitride oxide film, an aluminum nitride film, or an aluminum nitride oxide film with a thickness of 5 nm to 200 nm, inclusive.

In a case of forming the insulating film 102 with a two-layer structure including one barrier layer, a barrier layer for blocking impurities such as sodium is formed as the upper insulating film. The upper insulating film can be formed of a silicon nitride film, a silicon nitride oxide film, an aluminum nitride film, or an aluminum nitride oxide film with a thickness of 5 nm to 200 nm, inclusive. These films serving as barrier layers have a high blocking effect for preventing impurity diffusion, but their internal stress is also high. Therefore, as the lower insulating film which is in contact with the single crystal semiconductor substrate 101, a film with an effect of relieving the stress of the upper insulating film is preferably selected. As the lower insulating film, a silicon oxide film, a silicon oxynitride film, a thermally-oxidized film obtained by thermally oxidizing the single crystal semiconductor substrate 101, or the like is used. The thickness of the lower insulating film can be 5 nm to 200 nm, inclusive.

In this embodiment, the insulating film 102 has a two-layer structure including an insulating film 102a and an insulating film 102b. As a combination of the insulating film 102a and the insulating film 102b with which the insulating film 102 functions as a barrier layer, for example, the following combinations are given: a silicon oxide film and a silicon nitride film, a silicon oxynitride film and a silicon nitride film, a silicon oxide film and a silicon nitride oxide film, and a silicon oxynitride film and a silicon nitride oxide film.

For example, the insulating film 102a, the lower layer, can be formed of a silicon oxynitride film which is formed by a PECVD method using $SiH_4$ and $N_2O$ as process gases. Alternatively, as the insulating film 102a, a silicon oxide film can be formed by a PECVD method using organosilane and oxygen as process gases. Further alternatively, the insulating film 102a can be formed of an oxide film formed by oxidizing the single crystal semiconductor substrate 101.

Organosilane refers to, for example, the following compounds: tetraethyl orthosilicate (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

The insulating film 102b, the upper layer, can be formed of a silicon nitride oxide film by a PECVD method using $SiH_4$, $N_2O$, $NH_3$, and $H_2$ as process gases. Alternatively, the insulating film 102b can be formed of a silicon nitride film by a PECVD method using $SiH_4$, $N_2$, $NH_3$, and $H_2$ as process gases.

For example, a case of forming a silicon oxynitride film and a silicon nitride oxide film as the insulating film 102a and the insulating film 102b, respectively, by a PECVD method is described below. The single crystal semiconductor substrate 101 is transferred into a chamber of a PECVD apparatus. $SiH_4$ and $N_2O$ are supplied to the chamber as process gases for forming the insulating film 102a. Plasma of a mixed gas of those gases is generated, and a silicon oxynitride film is formed over the single crystal semiconductor substrate 101. Then, the process gases supplied to the chamber are changed to process gases for forming the insulating film 102b. Here, $SiH_4$, $N_2O$, $NH_3$, and $H_2$ are used. Plasma of a mixed gas of those gases is generated to form a silicon nitride oxide film. Thus, the silicon oxynitride film and the silicon nitride oxide film are successively formed. In a case of using a PECVD apparatus with a plurality of chambers, the silicon oxynitride film and the silicon nitride oxide film can be formed in different chambers. Needless to say, if the gases supplied to the chamber are changed, a silicon oxide film can be formed as the insulating film 102a, the lower layer, and a silicon nitride film can be formed as the insulating film 102b, the upper layer.

By thus forming the insulating film 102a and the insulating film 102b, the insulating film 102 can be formed over the single crystal semiconductor substrate 101 with high throughput. Further, since the insulating film 102a and the insulating film 102b can be formed without being exposed to air, the interface between the insulating film 102a and the insulating film 102b can be prevented from being contaminated by air.

Alternatively, an oxide film can be formed by oxidizing the single crystal semiconductor substrate 101 as the insulating film 102a. Thermal oxidation treatment for forming this oxide film can be dry oxidation, in which a gas containing a halogen is preferably added to an oxidizing atmosphere. An oxide film containing a halogen element can be formed as the insulating film 102a. As a gas containing a halogen element, one or plural kinds of gases selected from HCl, HF, $NF_3$, HBr, Cl, ClF, $BCl_3$, F, $Br_2$, dicholoehylene (DCE), or the like can be used. In a case of using trans-1,2-dichloroethylene as dichloehylene, since trans-1,2-dichloroethylene is thermally decomposed at low temperature, trans-1,2-dichloroethylene is effective when low-temperature thermal oxidation treatment is preferred. Note that instead of trans-1,2-dichloroethylene, cis-1,2-dichloroethylene, 1,1-dichloroethylene, or a mixed gas of two or more of those gases may be used.

For example, heat treatment is performed at a temperature of 700° C. or higher in an atmosphere which contains HCl at 0.5 to 10% by volume (preferably 3% by volume) with respect to oxygen. It is preferable that thermal oxidation be performed at a temperature from 950° C. to 1100° C., inclusive. Treatment time may be 0.1 to 6 hours, preferably, 0.5 to 1 hours. The thickness of the oxide film which is formed can be 10 nm to 1000 nm (preferably 50 nm to 200 nm), for example, 100 nm.

By performing oxidation treatment within such a temperature range, a gettering effect due to a halogen element can be obtained. Gettering has an effect of removing impurities such as metal, in particular. That is, by the action of a halogen element, impurities such as metal becomes volatile chloride and is released into air, whereby impurities are removed from the single crystal semiconductor substrate 101. Also, by a halogen element contained in the oxidizing atmosphere, dangling bonds on a surface of the single crystal semiconductor substrate 101 are terminated, and localized level density at an interface between the oxide film and the single crystal semiconductor substrate 101 can be reduced.

By this thermal oxidation treatment in an atmosphere containing a halogen element, a halogen element can be contained in the oxide film. By containing a halogen element at a concentration of $1\times10^{16}$ atoms/$cm^3$ to $5\times10^{21}$ atoms/$cm^3$, the oxide film can serve as a blocking film which prevents contamination of the single crystal semiconductor layer 112 by capturing impurities such as metal in the single crystal semiconductor substrate 101.

Further, by forming the insulating film 102a in a chamber of a PECVD apparatus containing a fluoride gas or a fluorine gas, the insulating film 102a containing a halogen element can be formed. A process gas for forming the insulating film 102a is supplied to such a chamber, this process gas is excited to generate plasma, and chemical reaction of active species in the plasma is caused; thus the insulating film 102a is formed over the single crystal semiconductor substrate 101.

Note that in this specification, oxynitride refers to a substance which contains more oxygen atoms than nitrogen atoms; whereas the nitride oxide refers to a substance which contains more nitrogen atoms than oxygen atoms. Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Figure 1C:
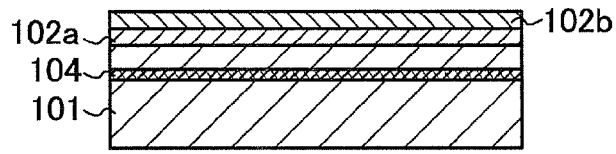

Next, through the insulating film 102, the single crystal semiconductor substrate 101 is irradiated with an ion beam 103, so that the ions are introduced into the single crystal semiconductor substrate 101; accordingly, a fragile region 104 is formed in a region at a predetermined depth from one surface of the single crystal semiconductor substrate 101 (see FIG. 1C).

The depth at which the fragile region 104 is formed can be controlled by the acceleration voltage of the ion beam 103 and the incident angle thereof. The fragile region 104 can be formed at the substantially the same depth as the average depth at which the ions have reached. The depth to which ions are introduced determines the thickness of the single crystal semiconductor layer separated from the single crystal semiconductor substrate 101. The depth at which the fragile region 104 is formed is adjusted so that the thickness of the single crystal semiconductor layer can be 20 nm to 500 nm, inclusive, preferably 20 nm to 200 nm, inclusive.

An ion doping apparatus can be used in order to add ions to the single crystal semiconductor substrate 101. In an ion doping apparatus, a source gas is excited to generate plasma, ions are extracted from the plasma, and the ions which are not mass-separated are introduced into an object to be processed. By using an ion doping apparatus, ions can be homogeneously introduced into the single crystal semiconductor substrate 101. Note that in an ion doping apparatus provided with a mass separator, ion implantation with mass separation can be conducted.

As a gas used in ion introduction, there are a hydrogen gas, a rare gas, and the like. In this embodiment, a hydrogen gas is preferably used. In a case where a hydrogen gas is used in an ion doping method, generated ions are $H^+$, $H_2^+$, and $H_3^+$, and it is preferable that the number of $H_3^+$ be the largest among the ions introduced into the single crystal semiconductor substrate. $H_3^+$ has higher introduction efficiency than $H^+$ or $H_2^+$, so that introduction time can be reduced. Further, a crack is easily generated in the fragile region 104 in a later step.

Figure 1D:
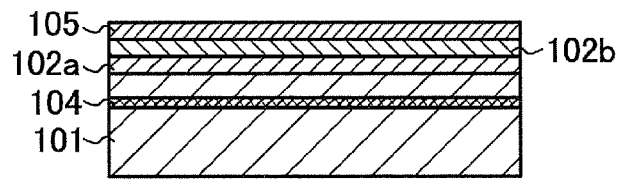

Then, after the fragile region 104 is formed, the insulating film 105 is formed over the insulating film 102 (see FIG. 1D). The insulating film 105 serves as a layer (a bonding layer) with which the single crystal semiconductor substrate 101 and the supporting substrate 111 are bonded to each other. The average surface roughness $R_a$ of the insulating film 105 is preferably 0.7 nm or less, more preferably, 0.4 nm or less. The thickness of the insulating film 105 can be 10 nm to 200 nm, inclusive; preferably 10 nm to 100 nm, inclusive; more preferably 20 nm to 50 nm, inclusive. The insulating film 105 may have a single-layer structure or a multilayer structure including two or more layers. A surface (a bonding surface) of the insulating film 105, which forms a bond with the supporting substrate 111 preferably has a smooth surface and becomes a hydrophilic surface.

In a step for forming the insulating film 105, the heating temperature of the single crystal semiconductor substrate 101 is set at a temperature at which elements or molecules which are introduced into the fragile region 104 is not precipitated, and the heating temperature is preferably 350° C. or lower. In other words, at this heating temperature, gas is not released from the fragile region 104. As the insulating film 105, an insulating film which is formed by a chemical vapor reaction is preferable. For example, a silicon oxide film, a silicon oxynitride film, a silicon nitride oxide film, a silicon nitride film, or the like can be formed as the insulating film 105. In the case of forming a silicon oxide film by a plasma-enhanced CVD (PECVD) method as the insulating film 105, it is preferable to use an organosilane gas and an oxygen ($O_2$) gas for a source gas. By using an organosilane for the source gas, a silicon oxide film having a smooth surface can be formed at a process temperature of 350° C. or lower. Alternatively, a low temperature oxide (LTO) can be formed at a temperature of 200° C. to 500° C., inclusive, by a thermal CVD method can be used. LTO can be formed using monosilane ($SiH_4$), disilane ($Si_2H_6$), or the like for a silicon source gas and dinitrogen monoxide ($N_2O$) or the like for an oxygen source gas.

For example, the condition example for forming the insulating film 105 of a silicon oxide film using TEOS and $O_2$ for a source gas is such that tetraethyl orthosilicate (TEOS) is introduced into a treatment chamber at a flow rate of 15 sccm and $O_2$ is introduced at a flow rate of 750 sccm. As a deposition pressure, a deposition temperature, an RF output power, and power frequency, 100 Pa, 300° C., 300 W, and 13.56 MHz are respectively given, for example.

Further, the order of the steps of FIG. 1C and FIG. 1D can be reversed. That is, the fragile region 104 can be formed after the insulating film 102 and the insulating film 105 are formed over the single crystal semiconductor substrate 101. In a case of forming the insulating film 102 and the insulating film 105 with one film formation apparatus, successive formation of the insulating film 102 and the insulating film 105 is preferable.

Further, after conducting the step of FIG. 1C, the steps of FIGS. 1B and 1D can be conducted. In other words, after irradiating the single crystal semiconductor substrate 101 with the ion beam 103 to form the fragile region 104, the insulating film 102 and the insulating film 105 can be formed. In a case where the insulating film 102 and the insulating film 105 can be formed with one film formation apparatus, successive formation of the insulating film 102 and the insulating film 105 is preferable. In addition, in order to protect a surface of the single crystal semiconductor substrate 101 from irradiation with the ion beam 103, before the fragile region 104 is formed, the single crystal semiconductor substrate 101 can be subjected to oxidation treatment to form an oxide film on the surface, and then the single crystal semiconductor substrate 101 can be irradiated with ions through the oxide film. This oxide film is removed after the fragile region 104 is formed. Alternatively, the insulating film 102 can be formed in a state where the oxide film remains.

Next, the supporting substrate 111 is prepared (see FIG. 1E). As the supporting substrate 111, a substrate formed of an insulator is used. Specifically, various glass substrates used in the electronics industry, such as substrates formed pf aluminosilicate glass, aluminoborosilicate glass, and bariumborosilicate glass can be given, as well as a quartz substrate, a ceramic substrate, and a sapphire substrate. In this embodiment, a case of using a glass substrate is described. By using a glass substrate which can have a large area and is inexpensive as the supporting substrate 111, the cost can be lower than the case of using a silicon wafer. Note that a surface of the supporting substrate 111 is preferably cleaned before the supporting substrate 111 is used. Specifically, ultrasonic cleaning is performed on the supporting substrate 111 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the supporting substrate 111 using a hydrochloric acid/hydrogen peroxide mixture. By such cleaning treatment, the surface of the supporting substrate 111 can be planarized and abrasive particles remaining on the surface can be removed.

Then, the single crystal semiconductor substrate 101 provided with the insulating film 102, the fragile region 104, and the insulating film 105 and the supporting substrate 111 are cleaned. This cleaning step can be performed by ultrasonic cleaning in pure water. The ultrasonic cleaning is preferably megahertz ultrasonic cleaning (megasonic cleaning). After the ultrasonic cleaning, it is preferable that one or both the single crystal semiconductor substrate 101 and the supporting substrate 111 be cleaned with ozone-containing water. By cleaning with ozone-containing water, an organic substance can be removed and surface activation treatment can be performed to improve hydrophilicity of the surface of the insulating film 105 or/and the supporting substrate 111. Other than ozone-containing water, cleaning treatment may be performed with oxygen-containing water, hydrogen-containing water, pure water, or the like. By such cleaning treatment, the bonding surface can be made hydrophilic and the number of OH groups on the bonding surface can be increased. Increase of OH groups can lead to a further strengthened bond by hydrogen bonding.

The activation treatment of the surface of the insulating film 105 or/and the supporting substrate 111 can be performed through irradiation with an atomic beam or an ion beam, plasma treatment, or radical treatment as well as cleaning with ozone-containing water. In the case of using an atomic beam or an ion beam, an inert gas neutral atom beam or an inert gas ion beam of argon or the like can be used. Such surface treatment facilitates bonding between different kinds of materials even at a temperature of 400° C. or lower.

Figure 1F:
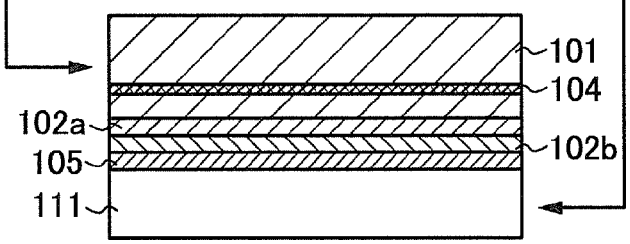

Then, the surface of the single crystal semiconductor substrate 101 and the surface of the supporting substrate 111 are made to face each other and a surface of the insulating film 105 and the supporting substrate 111 are closely attached (see FIG. 1F). By closely attaching the insulating film 105 and the supporting substrate 111, the substrates attract each other by van der Waals forces. Then, a pressure of about 300 N/cm² to 15000 N/cm² is applied to one part of the edge of the single crystal semiconductor substrate 101. The pressure is preferably 1000 N/cm² to 5000 N/cm². Si—OH on the surfaces of the insulating film 105 and the supporting substrate attach each other by hydrogen bonding in the pressurized part, and the attached part extends to the substantially whole plane of the insulating film 105. As a result, the single crystal semiconductor substrate 101 is attached to the supporting substrate 111. This attaching step can be performed at room temperature without heat treatment; therefore, a substrate having low heat resistance and having an upper temperature limit of 700° C. or lower such as a glass substrate can be used as the supporting substrate 111.

After the supporting substrate 111 is attached to the single crystal semiconductor substrate 101, it is preferable to perform heat treatment to increase the bonding force at the bonding interface between the supporting substrate 111 and the insulating film 105. This treatment is performed at a temperature at which the fragile region 104 does not crack; specifically, the temperature is in the range of 200° C. to 450° C., inclusive. By performing the heat treatment at such a temperature range, a dehydration condensation reaction occurs to form a bond (Si—O—Si) from which a water molecule is released and in which an oxygen atom is present between silicon atoms. Therefore, the bonding force at the bonding interface between the supporting substrate 111 and the insulating film 105 can be increased.

Then, heat treatment is performed so that the single crystal semiconductor substrate 101 is divided (cleaved) along the fragile region 104 to be separated into a single crystal semiconductor layer attached to the supporting substrate and the single crystal semiconductor substrate. FIG. 1F illustrates a step in which the single crystal semiconductor layer 112 is separated from the single crystal semiconductor substrate 101.

By the heat treatment, the element added by ion doping is precipitated in the microvoids formed in the fragile region 104 due to increase in temperature, whereby internal pressure increases. Due to increase in pressure, the volume of the microvoids in the fragile region 104 changes to generate a crack in the fragile region 104. Thus, a cleavage plane for separating the single crystal semiconductor substrate 101 is generated in the fragile region 104. Because the insulating film 105 is bonded to the supporting substrate 111, the single crystal semiconductor layer 112 which is separated from the single crystal semiconductor substrate 101 is fixed to the supporting substrate 111. The heat treatment for separating the single crystal semiconductor layer 112 from the single crystal semiconductor substrate 101 is performed at a temperature which does not exceed a strain point of the supporting substrate 111.

For the heat treatment, a rapid thermal anneal (RTA) apparatus, a resistance heating furnace, or a microwave heating apparatus can be used. For the RTA apparatus, an RTA of a gas heating method using a heated gas (gas rapid thermal anneal (GRTA)) or an RTA of a lamp heating method (lamp rapid thermal anneal (LRTA)) can be used. It is preferable that the temperature of the supporting substrate 111 to which the single crystal semiconductor layer 112 is attached be increased to be in the range of 550° C. to 650° C., inclusive, by this heat treatment.

Figure 1G:
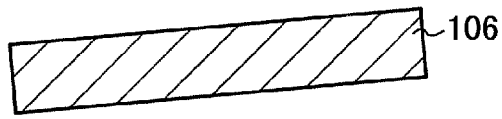
Figure 1G:
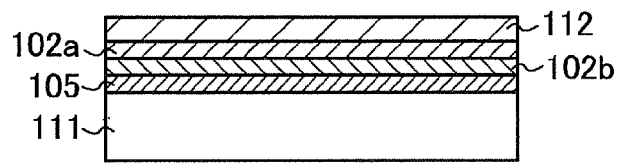

By performing heat treatment to divide (cleave) the single crystal semiconductor substrate 101 along the fragile region 104 as described thus far, the single crystal semiconductor layer 112 can be provided over the supporting substrate 111 with the insulating film 102 and the insulating film 105 interposed therebetween (see FIG. 1G). In addition, by reusing a single crystal semiconductor substrate 106 from which the single crystal semiconductor layer 112 is separated, the manufacturing cost can be reduced. In the heat treatment step illustrated in FIG. 1F, a heating temperature is 700° C. or lower, which is relatively low; therefore, damage to the single crystal semiconductor substrate 106 due to heat can be suppressed, which is effective in the case of reusing the single crystal semiconductor substrate 101.

By the foregoing steps, a semiconductor substrate in which the single crystal semiconductor layer 112 is provided over the supporting substrate 111 with the insulating film 102 and the insulating film 105 interposed therebetween can be manufactured.

Figure 2A:
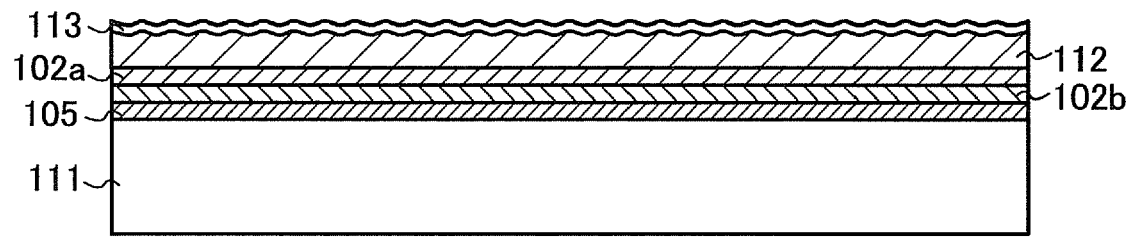
FIGS. 2A to 2D illustrate a method for manufacturing an SOI substrate of Embodiment 1.

As for the single crystal semiconductor layer 112 of FIG. 2A, the crystallinity of the surface of and in the single crystal semiconductor layer 112 is deteriorated due to an ion introduction step for forming the fragile region 104 or a separation step. For example, crystal defects remain in the single crystal semiconductor layer 112 and the fragile region or damage remains on the surface of the single crystal semiconductor layer 112. Further, if the separation is not smoothly conducted in releasing the single crystal semiconductor layer 112, there arise problems such as, for example, a rough surface, variation in thickness, and generation of minute chinks of the single crystal semiconductor layer 112. It is difficult to form a gate insulating layer which is thin and has high withstand voltage on such a surface of the single crystal semiconductor layer 112 with low planarity. Further, in the case where crystal defects are in the single crystal semiconductor layer 112, characteristics and reliability of the transistor may adversely be affected, for example, a localized level density at the interface with the gate insulating layer increases. Therefore, planarization treatment is performed for improving the planarity and crystallinity of the single crystal semiconductor layer 112. The planarization treatment on the single crystal semiconductor layer 112 can be performed by combination of etching treatment and irradiation with laser light. With the planarization treatment, reduction of crystal defects on the surface of and in the single crystal semiconductor layer 112, recovery of crystallinity, and planarization of the surface of the single crystal semiconductor layer 112 can be achieved. Note that surface unevenness of the single crystal semiconductor layer 112 of FIG. 2A only schematically illustrates a rough surface and poor planarity, and the actual shape is not limited thereto.

As illustrated in FIG. 2A, a native oxide film 113 is formed on the surface of the single crystal semiconductor layer 112 which is separated from the single crystal semiconductor substrate 101. Contaminant such as dust attaches to a surface of the native oxide film 113. Therefore, before irradiation with laser light 107, the native oxide film 113 which is formed on the surface of the single crystal semiconductor layer 112 and crystal defects remaining on the surface of the single crystal semiconductor layer 112 are preferably removed. After removing the native oxide film 113 and crystal defects by etching treatment, irradiation with laser light is performed; thus, planarization and recovery of the crystallinity of the single crystal semiconductor layer 112 can be more effective. The native oxide film 113 and crystal defects of the surface of the single crystal semiconductor layer 112 are preferably removed by dry etching. In a case of removing the native oxide film 113 and crystal defects of the surface of the single crystal semiconductor layer 112 by wet etching, if there are minute chinks in the single crystal semiconductor layer 112, there is a risk that a chemical solution may enter the supporting substrate 111 through the minute chinks and erode the supporting substrate 111.

The etching treatment for the native oxide film 113 and the single crystal semiconductor layer 112 is not particularly limited as long as dry etching can be conducted. For example, a reactive ion etching (RIE) method, an inductively coupled plasma (ICP) etching method, an electron cyclotron resonance (ECR) etching method, a parallel plate (capacitive coupled plasma) etching method, a magnetron plasma etching method, a dual-frequency plasma etching method, or a helicon wave plasma etching method may be used, for example. Etching can be conducted by using, for example, a chlorine-based gas such as $Cl_2$, $BCl_3$, or $SiCl_4$; a fluorine-based gas such as $CHF_3$, $CF_4$, $C_4F_8$, $C_2F_6$, $NF_3$, or sulfur fluoride; or a boron-based gas such as HBr as an etching gas. Further, an inert gas such as He, Ar, or Xe, an $O_2$ gas, or an $H_2$ gas can be used. The etching treatment for removing the native oxide film 113 and the surface of the single crystal semiconductor layer 112 is referred to as first etching treatment. The first etching treatment may include a plurality of steps. For example, after the native oxide film 113 is removed, the surface of the single crystal semiconductor layer 112 is removed. In specific, the first etching can be conducted as follows: after the native oxide film is removed with an inert gas such as Ar, the fragile region or damage which remains on the surface of the single crystal semiconductor layer 112 is removed with a chlorine-based gas such as chlorine. Since the size or depth of defects in the single crystal semiconductor layer 112 depends on the amount of energy or dosage of ions which are added, the thickness of a surface of the single crystal semiconductor layer 112 which is removed by the first etching treatment may be set as appropriate depending on the thickness and surface roughness of the single crystal semiconductor layer 112 before the etching treatment.

Figure 2B:
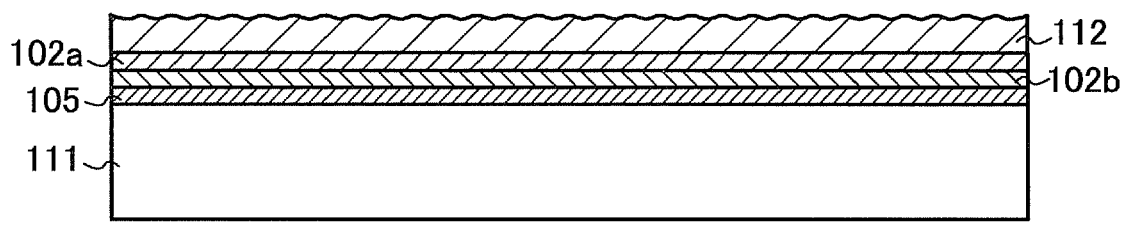

By performing the first etching treatment as described above, the native oxide film 113 can be removed and the surface of the single crystal semiconductor layer 112 can be purified (see FIG. 2B). In addition, crystal defects of the surface of the single crystal semiconductor layer 112 can be removed by the first etching treatment, whereby the surface roughness of the single crystal semiconductor layer 112 can be reduced.

Further, there are generated crystal defects in the single crystal semiconductor layer 112 due to the ion introduction step for forming the fragile region 104. Further, there is a case in which minute chinks occur in the single crystal semiconductor layer 112 because smooth cleavage for releasing the single crystal semiconductor layer 112 from the single crystal semiconductor substrate 101 has not been conducted. Therefore, the single crystal semiconductor layer 112 is irradiated with the laser light 107 for reduction of crystal defects in the single crystal semiconductor layer 112, recovery of the crystallinity, and planarization of the single crystal semiconductor layer 112.

Figure 2C:
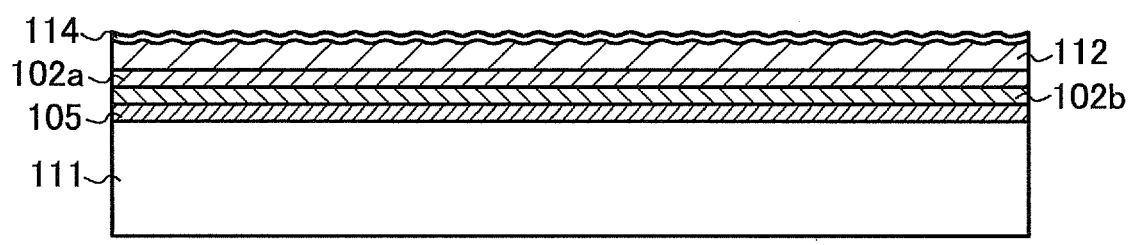

As illustrated in FIG. 2C, a native oxide film 114 may be newly formed on the surface of the single crystal semiconductor layer 112 which is subjected to the first etching treatment. Therefore, before the single crystal semiconductor layer 112 is irradiated with the laser light 107, the native oxide film 114 which is formed on the surface of the single crystal semiconductor layer 112 should be removed. This is because if the single crystal semiconductor layer 112 is irradiated with the laser light 107 with the native oxide film 114 remaining on the surface of the single crystal semiconductor layer 112, the effects of the laser light irradiation, that is, reduction of crystal defects in the single crystal semiconductor layer 112, recovery of the crystallinity, and planarization of the single crystal semiconductor layer 112 cannot be sufficiently achieved. In addition, if the single crystal semiconductor layer 112 is irradiated with the laser light 107 with the native oxide film 114 remaining, roughness or large unevenness may occur on the surface of the single crystal semiconductor layer 112.

The native oxide film 114 can be removed by etching treatment. The etching treatment for removing the native oxide film 114 is preferably dry etching. In a case of removing the native oxide film 113 by wet etching, if there are minute chinks in the single crystal semiconductor layer 112, there is a risk that a chemical solution may enter the supporting substrate 111 through the minute chinks, erode the supporting substrate 111, and form a cavity in the supporting substrate 111. If the supporting substrate 111 which has been eroded is irradiated with laser light, the air in the cavity is heated, whereby the single crystal semiconductor layer is excessively heated and broken.

The etching treatment before irradiation with the laser light 107 is not particularly limited as long as dry etching can be conducted. For example, a reactive ion etching (RIE) method, an inductively coupled plasma (ICP) etching method, an electron cyclotron resonance (ECR) etching method, a parallel plate (capacitive coupled plasma) etching method, a magnetron plasma etching method, a dual-frequency plasma etching method, or a helicon wave plasma etching method may be used, for example. Etching can be conducted by using, for example, a chlorine-based gas such as $Cl_2$, $BCl_3$, or $SiCl_4$; a fluorine-based gas such as $CHF_3$, $CF_4$, $C_4F_8$, $C_2F_6$, $NF_3$, or sulfur fluoride; a boron-based gas such as HBr as an etching gas. Further, an inert gas such as He, Ar, or Xe, $O_2$, or $H_2$ can be used. These etching gases can be used alone or in combination. In this embodiment, for example, when an ICP etching method is used, etching may be performed under the following conditions: the flow rate of argon, which is an etching gas: 100 sccm; power applied to a coil electrode: 500 W; power applied to a lower electrode (on the bias side): 500 W; and the reaction pressure: 1.35 Pa. The etching treatment which is performed before irradiation of the single crystal semiconductor layer 112 with the laser light 107 is referred to as second etching treatment.

Figure 2D:
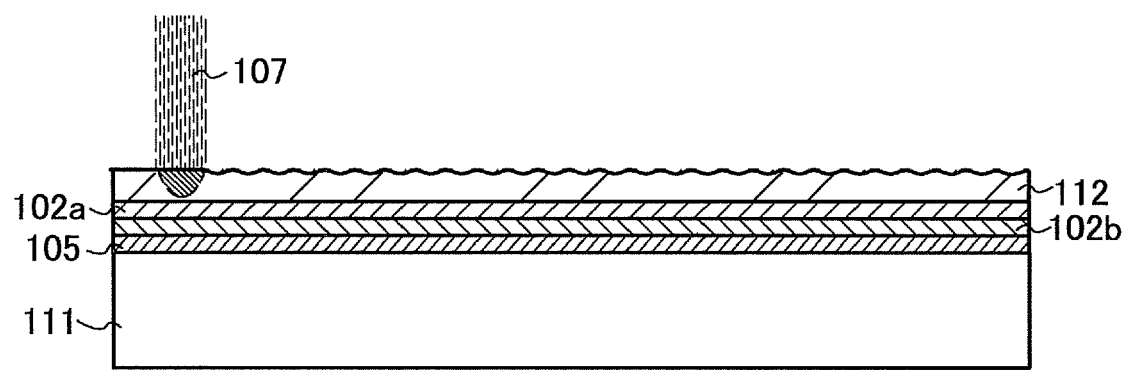

After the native oxide film 114 is removed, the surface of the single crystal semiconductor layer 112 is irradiated with the laser light 107 (see FIG. 2D). By irradiation of the single crystal semiconductor layer 112 with the laser light 107, the single crystal semiconductor layer 112 can be melted. A portion in the single crystal semiconductor layer 112 which is melted by irradiation with the laser light 107 is cooled and solidified, whereby the planarity is improved. By the irradiation with the laser light 107, in addition to the improvement in planarity, crystal defects in the single crystal semiconductor layer 112 can be reduced and the crystallinity of the single crystal semiconductor layer 112 can be improved. With the use of the laser light 107, the supporting substrate 111 is not directly heated; therefore, increase in temperature of the supporting substrate 111 can be suppressed.

Note that it is preferable that the single crystal semiconductor layer 112 be partially melted by irradiation with the laser light 107. This is because, if the single crystal semiconductor layer 112 is entirely melted, it is highly likely that microcrystallization occurs due to disordered nucleation in a liquid phase and that the crystallinity of the single crystal semiconductor layer is lowered. On the other hand, if the single crystal semiconductor layer 112 is partially melted, crystal growth proceeds from a solid phase part which is not melted. Thus, crystal defects in the single crystal semiconductor layer 112 can be reduced. Note that entire melting here means that the single crystal semiconductor layer 112 is melted to the vicinity of the lower interface to be made in a liquid phase. On the other hand, partial melting here means that an upper part of the single crystal semiconductor layer 112 is melted to be in a liquid phase while a lower part thereof is not melted to be kept in a solid phase.

A laser emitting the laser light 107 may be a continuous wave laser, a quasi-continuous wave laser, or a pulsed laser. A pulsed laser is preferably used because a pulsed laser can emit pulsed laser light having high energy instantaneously and a melting state can be formed easily. The repetition rate is preferably about 1 Hz to 10 MHz, inclusive.

As the laser, for example, a gas laser such as an excimer laser like a KrF laser, an Ar laser, or a Kr laser can be used. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser may be used. Note that an excimer laser is a pulsed laser, and some solid lasers such as a YAG laser can be used as a continuous laser, a quasi-continuous wave laser, and a pulsed laser.

A wavelength of the laser light is set to be a wavelength which is absorbed in the single crystal semiconductor layer 112 and can be determined in consideration of the skin depth of the laser light and the like. For example, the wavelength can be in the range of 250 nm to 700 nm, inclusive. Further, the energy of the laser light can be determined in consideration of the wavelength of the laser light, the skin depth of the laser light, the thickness of the single crystal semiconductor layer 112, and the like. The energy of the laser light can be, for example, in the range of 300 mJ/cm$^2$ to 1 J/cm$^2$, inclusive. Irradiation with laser light can be performed in an atmosphere containing oxygen such as the atmospheric air or in an inert atmosphere such as a nitrogen atmosphere. An inert atmosphere such as nitrogen can more effectively improve planarity of the single crystal semiconductor layer 112 than the atmospheric air, and can more effectively suppress generation of chinks than the atmospheric air.

Note that in irradiation with laser light, the single crystal semiconductor layer 112 which is fixed to the supporting substrate 111 may be heated to increase the temperature of the single crystal semiconductor layer 112. The heating temperature is preferably 400° C. to 670° C., inclusive; more preferably, 450° C. to 650° C., inclusive.

In this embodiment, the irradiation step of the laser light 107 can be conducted as follows. As a laser emitting the laser light 107, a XeCl excimer laser (wavelength: 308 nm, pulse width: 25 ns, and repetition rate: 30 Hz) is used. The cross section of the laser light 107 is shaped into a linear shape with a size of 150 mm×0.34 mm through an optical system. The single crystal semiconductor layer 112 is irradiated with the laser light 107 with a scanning speed of the laser light 107 of 1.0 mm/second, a scanning pitch of 33 μm, and the number of shots is 10. The laser light 107 is scanned with an irradiation surface while the surface is sprayed with a nitrogen gas. In a case where the supporting substrate 111 has a size of 730 mm×920 mm, since the beam length of the laser light is 150 mm, a region which is irradiated with the laser light 107 is divided into six parts, whereby the single crystal semiconductor layer 112 which is attached to the supporting substrate 111 can be irradiated with the laser light 107.

By irradiation with the laser light 107 as describes above, the surface of the supporting substrate 111 can be heated and cooled in a short time; therefore, increase in temperature of the supporting substrate 111 can be suppressed and a substrate having a low upper temperature limit such as a glass substrate can be used as the supporting substrate 111. Therefore, even a substrate having a low upper temperature limit such as a glass substrate is used as the supporting substrate 111, damage of the single crystal semiconductor layer due to the ion introduction step can be sufficiently repaired.

By the first etching treatment on the single crystal semiconductor layer 112 attached to the supporting substrate 111, the native oxide film 113 and crystal defects of the surface of the single crystal semiconductor layer 112 are removed and surface roughness of the single crystal semiconductor layer 112 can be reduced. In addition, by irradiating the single crystal semiconductor layer 112 with laser light after the first etching treatment, defects are prevented from occurring in the single crystal semiconductor layer 112 when the single crystal semiconductor layer 112 is melted. Further, by the second etching treatment before irradiating the single crystal semiconductor layer 112 with laser light, the laser light irradiation can be more effective. Therefore, by irradiating the single crystal semiconductor layer 112 with the laser light 107 after conducting the first etching treatment and the second etching treatment on the single crystal semiconductor layer 112, reduction of crystal defects on the surface of and in the single crystal semiconductor layer 112, recovery of the crystallinity, and planarization of the surface of the single crystal semiconductor layer 112 can be achieved.

Figure 3A:
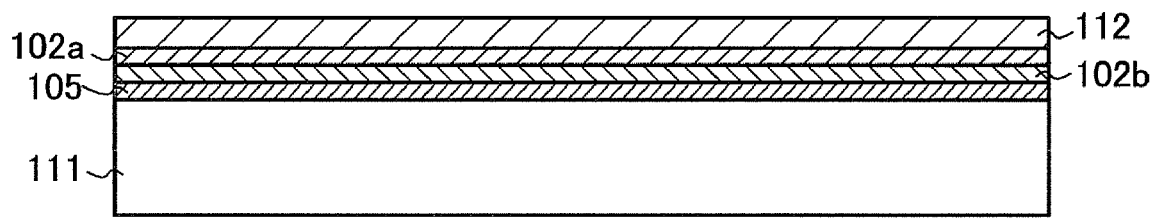
FIGS. 3A and 3B illustrate a method for manufacturing an SOI substrate of Embodiment 1.

Then, thinning treatment is performed for reducing the thickness of the single crystal semiconductor layer 112 to such a thickness that is optimal for a semiconductor element to be formed later (see FIG. 3A). The thickness of the single crystal semiconductor layer 112 can be reduced by treatment similar to the first etching treatment. For example, in a case where the single crystal semiconductor layer 112 is of silicon, the thickness of the single crystal semiconductor layer 112 can be reduced by dry etching using $SF_6$ and $O_2$ as process gases.

After the thinning treatment, heating treatment is preferably performed on the single crystal semiconductor layer 112 at 500° C. to 700° C., inclusive. This heating treatment can repair defects of the single crystal semiconductor layer 112 which have not been repaired in the irradiation with the laser light 107 and can reduce distortion of the single crystal semiconductor layer 112. For the heating treatment, a rapid thermal anneal (RTA) apparatus, a resistance heating furnace, or a microwave heating apparatus can be used. For the RTA apparatus, an RTA apparatus of a gas heating method using a heated gas or an RTA apparatus of a lamp heating method can be used. For example, when a resistance heating furnace is used, heat treatment may be performed at 550° C. for four hours.

Figure 3B:
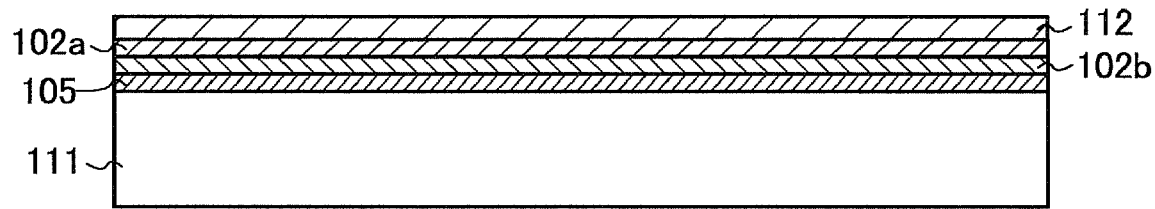

By the above-described steps, an SOI substrate illustrated in FIG. 3B can be manufactured.

By the foregoing steps, an SOI substrate in which the single crystal semiconductor layer 112 is provided over the supporting substrate 111 with the insulating film 102 and the insulating film 105 interposed therebetween can be manufactured. By using the manufacturing method described in this embodiment, an SOI substrate with reduced crystal defects and favorable planarity of the single crystal semiconductor layer 112 can be provided. By using this SOI substrate, a semiconductor element with excellent characteristics can be formed.

Embodiment 2

A structure of an SOI substrate which is different from the structure of the SOI substrate described in Embodiment 1 will now be described in this embodiment. Note that in this embodiment, the same reference numerals denote the same parts as in Embodiment 1, and a detailed description is omitted.

Figure 4:
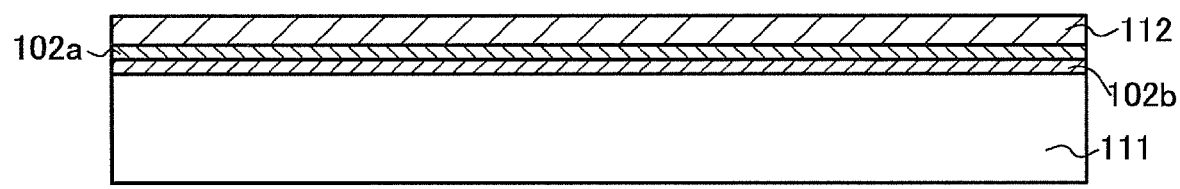
FIG. 4 illustrates a structure of an SOI substrate of Embodiment 2.

A structure in which the single crystal semiconductor layer 112 is formed over the supporting substrate 111 with the insulating film 102b and the insulating film 102a interposed therebetween is illustrated in FIG. 4. First, the insulating film 102a is formed over the single crystal semiconductor substrate 101. Then, the fragile region 104 is formed in the single crystal semiconductor substrate 101 by ion beam irradiation. Then, the insulating film 102b which serves as a bonding layer is formed over the insulating film 102a. After the insulating film 102b is formed, the single crystal semiconductor substrate 101 and the supporting substrate 111 are attached with the insulating film 102a and the insulating film 102b interposed therebetween. Then, by dividing the single crystal semiconductor substrate 101 along the fragile region 104 by heat treatment, the single crystal semiconductor layer 112 can be formed over the supporting substrate 111 with the insulating film 102a and the insulating film 102b interposed therebetween. Then, planarization treatment and thinning treatment are performed on the single crystal semiconductor layer 112, whereby an SOI substrate according to the present invention can be manufactured. The planarization treatment and the thinning treatment may be performed by the method illustrated in FIGS. 2A to 2D and FIGS. 3A and 3B; therefore, detailed description thereof is omitted. By the above-described steps, the SOI substrate illustrated in FIG. 4 can be manufactured.

Figure 5:
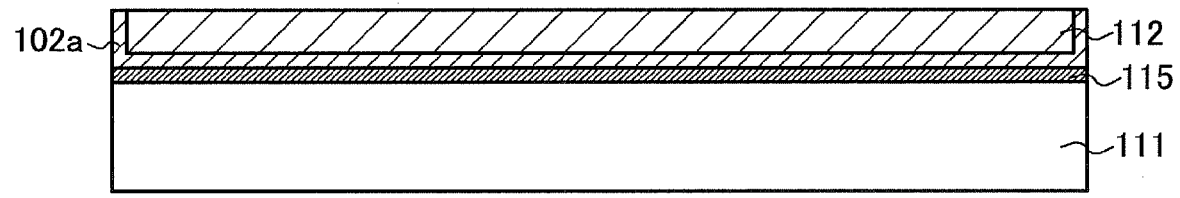
FIG. 5 illustrates a structure of an SOI substrate of Embodiment 2.

In the structure illustrated in FIG. 5, the single crystal semiconductor layer 112 is formed over the supporting substrate 111 with an insulating film 115 and the insulating film 102a interposed therebetween. First, the insulating film 102a is formed over the single crystal semiconductor substrate 101. The insulating film 102a preferably is an oxide film formed by thermal oxidation treatment. The insulating film 102a served as a bonding layer. Then, by ion beam irradiation, the fragile region 104 is formed in the single crystal semiconductor substrate 101.

Then, planarization treatment is performed with plasma on a surface of the supporting substrate 111. Here, planarization treatment is performed in a plasma sate by introducing an inert gas (e.g., an Ar gas) and/or a reactive gas (e.g., an $O_2$ gas or an $N_2$ gas) into a vacuum chamber and applying bias voltage to a surface to be processed (here, the supporting substrate 111). In plasma, electrons and cations of Ar are present, and the cations of Ar are accelerated toward a cathode (toward the supporting substrate 111). The accelerated cations of Ar collide with the surface of the supporting substrate 111 so that the surface of the supporting substrate 111 is sputter etched. In this sputter etching, a projection of the surface of the supporting substrate 111 is preferentially sputter etched, whereby planarity of the surface of the supporting substrate 111 can be improved. In the case where a reactive gas is introduced, defects which occur due to the sputter etching performed on the surface of the supporting substrate 111 can be repaired.

By performing planarization treatment with plasma treatment, the surface of the supporting substrate 111 is set as follows: average surface roughness ($R_a$) is preferably 0.5 nm or less, more preferably 0.3 nm or less; and maximum height difference (P–V) is preferably 6 nm or less, more preferably 3 nm or less. Specific conditions can be set as follows: an electric power used for treatment is 100 W to 1000 W, a pressure is 0.1 Pa to 2.0 Pa, a gas flow rate is 5 sccm to sccm, and a bias voltage is 200 V to 600 V.

Further, when the above-described plasma treatment is performed, by performing precoating treatment on an inner wall of the chamber, a metal constituting the reaction chamber (iron (Fe), nickel (Ni), chromium (Cr), or the like) can be prevented from being attached to the surface of the supporting substrate 111 as impurities. For example, by covering an inner wall of the reaction chamber with an insulating film such as a silicon oxide film, a silicon film, an aluminum oxide film, or a silicon carbide (SiC) film, contamination of the surface of the supporting substrate 111, which accompanies the planarization treatment, can be suppressed.

As described above, by performing planarization treatment, planarity of the surface of the supporting substrate 111 can be improved. Even in the case where a substrate polished by CMP or the like is used as the supporting substrate 111, abrasive particles ($CeO_2$ or the like) which remain over the supporting substrate 111 can be removed and the surface of the supporting substrate 111 can be planarized. As a result, planarity of a film which is formed over the supporting substrate 111 can be improved. Note that the supporting substrate 111 may be cleaned before performing planarization treatment on the supporting substrate 111. Specifically, ultrasonic cleaning is performed on the supporting substrate 111 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the supporting substrate 111 using a hydrochloric acid/hydrogen peroxide mixture. By such cleaning treatment, the surface of the supporting substrate 111 can be planarized and abrasive particles remaining on the surface can be removed to some extent.

Next, the insulating film 115, which is not an Si-based insulating film, is formed over the supporting substrate 111. As the insulating film 115, an oxide film or a nitride film containing one or a plurality of elements selected from aluminum, magnesium, strontium, titanium, tantalum, zirconium, or yttrium can be used. In this embodiment, an oxide film containing aluminum oxide as its main component is used as the insulating film 115. The oxide film containing aluminum oxide as its main component refers to an oxide film in which aluminum oxide is contained at 10 wt. % or more where the total amount of all components in the oxide film is 100 wt. %. Alternatively, a film which contains aluminum oxide as its main component and contains either or both magnesium oxide and strontium oxide can be used as the insulating film 115. Further alternatively, an aluminum oxide film containing nitrogen may be used as the insulating film 115.

The insulating film 115 can be formed by a sputtering method. As a material of a target used for a sputtering method, for example, metal containing aluminum (Al) or metal oxide such as aluminum oxide can be used. Note that a material of the target can be selected as appropriate in accordance with a film to be formed. In addition, it is preferable that the above-described planarization treatment and formation of the insulating film 115 by a sputtering method be performed successively without exposure to air. By performing the steps successively, throughput can be improved. Further, after the surface of the supporting substrate 111 is planarized by plasma treatment, the surface of the supporting substrate 111 is activated and impurities such as an organic substance likely attach the surface of the supporting substrate 111; however, by performing the steps successively, attachment of impurities to the supporting substrate 111 can be suppressed.

In the case where a metal is used as a sputtering target, sputtering is performed while a reactive gas (e.g., oxygen) is introduced (a reactive sputtering method) to form the insulating film 115. As a metal, aluminum, magnesium (Mg), an alloy containing aluminum and magnesium, an alloy containing aluminum and strontium (Sr), or an alloy containing aluminum, magnesium, and strontium can be used. In this case, sputtering can be performed using a direct current (DC) power source or a radio frequency (RF) power source.

For example, sputtering can be performed under the following conditions: aluminum is used as a target, a gas flow rate of argon is 0 sccm to 100 sccm, a gas flow rate of oxygen is 5 sccm to 100 sccm, a deposition pressure is 0.1 Pa to 2.0 Pa, a deposition power is 0.5 kW to 4 kW, and a distance between a target and a substrate (also referred to as a T-S distance) is 50 mm to 185 mm. Note that by performing sputtering using an inert gas (e.g., argon) before formation of the insulating film 115 or by forming a film over a dummy substrate in advance, dust generated when the insulating film 115 is formed over the supporting substrate 111 can be reduced.

In the case where metal oxide is used as a target, by performing sputtering using a radio frequency (RF) power source (an RF sputtering method), the insulating film 115 is formed. As metal oxide, as well as aluminum oxide, magnesium oxide, strontium oxide, oxide containing aluminum and magnesium, oxide containing aluminum and strontium, or oxide containing aluminum, magnesium, and strontium can be used. For example, sputtering can be performed under the following conditions: aluminum oxide is used as a target, a gas flow rate of argon is 0 sccm to 100 sccm, a gas flow rate of oxygen is 5 sccm to 100 sccm, a deposition pressure is 0.1 Pa to 2.0 Pa, a deposition power is 0.5 kW to 4 kW, and a distance between a target and a substrate (T-S distance) is 50 mm to 185 mm.

Alternatively, a bias sputtering method may be employed in order to form the insulating film 115. In a bias sputtering method, at the same time as deposition from a target, bias voltage is applied to a surface to be processed (here, the supporting substrate 111) and ions are injected to the surface to be processed; thus, the surface to be processed is etched and substances separated from the surface to be processed when the surface to be processed is etched are reattached thereto, at the same time as deposition from a target. Because projections of the surface of the supporting substrate 111 are preferentially etched, the insulating film 115 can be deposited while the surface of the supporting substrate 111 is planarized. Thus, in the case where a bias sputtering method is employed, planarization treatment which is performed on the supporting substrate 111 before formation of the insulating film 115 may be omitted.

A bias sputtering method can be employed under the following conditions: aluminum is used as a target, a gas flow rate of argon is 0 sccm to 100 sccm, a gas flow rate of oxygen is 5 sccm to 100 sccm, a deposition pressure is 0.1 Pa to 2.0 Pa, a deposition power is 0.5 kW to 4 kW, a distance between a target and a substrate (T-S distance) is 50 mm to 185 mm.

By providing an oxide film containing aluminum oxide as its main component over the supporting substrate 111, impurities such as movable ions and moisture contained in the supporting substrate 111 can be prevented from being diffused into a single crystal semiconductor layer which is formed over the supporting substrate 111 later.

Then, the single crystal semiconductor substrate 101 and the supporting substrate 111 are attached with the insulating film 102a and the insulating film 115 interposed therebetween. Then, by dividing the single crystal semiconductor substrate 101 along the fragile region 104 by heat treatment, the single crystal semiconductor layer 112 can be formed over the supporting substrate 111 with the insulating film 115 and the insulating film 102a interposed therebetween. Then, planarization treatment and thinning treatment are performed on the single crystal semiconductor layer 112, whereby an SOI substrate according to the present invention can be manufactured. The planarization treatment and the thinning treatment may be performed by the method illustrated in FIGS. 2A to 2D and FIGS. 3A and 3B; therefore, detailed description thereof is omitted. By above-described steps, the SOI substrate illustrated in FIG. 5 can be manufactured.

Figure 6:
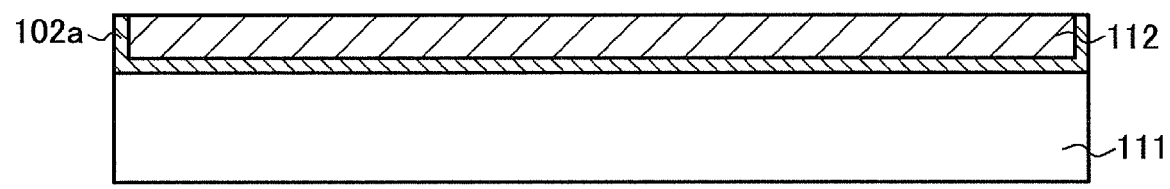
FIG. 6 illustrates a structure of an SOI substrate of Embodiment 2.

In the structure illustrated in FIG. 6, the single crystal semiconductor layer 112 is formed over the supporting substrate 111 with the insulating film 102a interposed therebetween. First, the insulating film 102a serving as a bonding layer is formed over the single crystal semiconductor substrate 101. The insulating film 102a is formed by forming an oxide film by thermal oxidation treatment on the single crystal semiconductor substrate 101. Thermal oxidation treatment for forming this oxide film can be dry oxidation, in which a gas containing a halogen element is preferably added to an oxidizing atmosphere. Then, the single crystal semiconductor substrate 101 and the supporting substrate 111 are attached to each other with the insulating film 102a interposed therebetween. Then, by dividing the single crystal semiconductor substrate 101 along the fragile region 104 by heat treatment, the single crystal semiconductor layer 112 can be formed over the supporting substrate 111 with the insulating film 102a interposed therebetween. Then, planarization treatment and thinning treatment are performed on the single crystal semiconductor layer 112, whereby an SOI substrate according to the present invention can be manufactured. The planarization treatment and the thinning treatment may be performed by the method illustrated in FIGS. 2A to 2D and FIGS. 3A and 3B; therefore, detailed description thereof is omitted. By above-described steps, the SOI substrate illustrated in FIG. 6 can be manufactured.

Embodiment 3

In this embodiment, a method for manufacturing a complementary metal oxide semiconductor (CMOS) is described with reference to FIGS. 7A to 7E and FIGS. 8A to 8D as an example of a method for manufacturing a semiconductor device including a high performance and highly reliable semiconductor element, with high yield. Note that repeated description for the like portions or portions having like functions to the portions in Embodiments 1 and 2 are omitted.

Figure 7A:
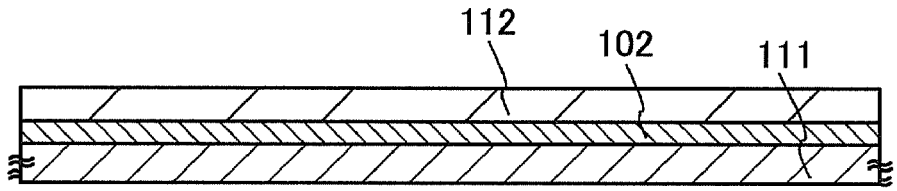
FIGS. 7A to 7E illustrate a method for manufacturing a semiconductor device of Embodiment 3.

In FIG. 7A, the insulating film 102 and the single crystal semiconductor layer 112 are formed over the supporting substrate 111. Note that, although an example in which the SOI substrate having the structure illustrated in FIG. 4 is used is described here, an SOI substrate having another structure described in this specification can be used.

The single crystal semiconductor layer 112 is separated from the single crystal semiconductor substrate 101 and is subjected to planarization treatment. The planarization treatment can be performed by combination of etching treatment and laser light irradiation. Here, since recovery of the crystallinity and planarization of the single crystal semiconductor layer 112 are performed by the first etching treatment, the second etching treatment, and following laser light irradiation, which are described in Embodiment 1, the single crystal semiconductor layer 112 has reduced crystal defects and higher planarity.

Figure 7B:
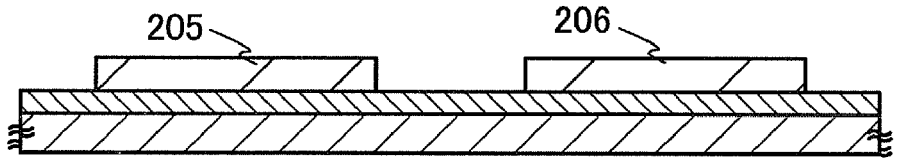

The single crystal semiconductor layer 112 is etched into island shapes to form separated single crystal semiconductor layers 205 and 206 in accordance with the positions of the semiconductor elements (see FIG. 7B).

Before conducting etching to form the single crystal semiconductor layers 205 and 206, it is preferable to add an impurity element such as boron, aluminum, or gallium, or an impurity element such as phosphorus or arsenic, to the single crystal semiconductor layer 112 in order to control the threshold voltage of the TFTs. For example, an impurity element is added to a region where an n-channel TFT is to be formed, and an impurity element is added to a region where a p-channel TFT is to be formed.

Figure 7C:
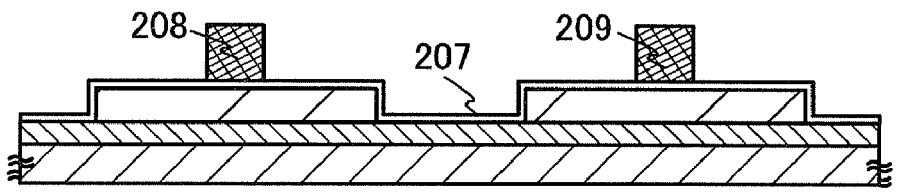
Figure 7D:
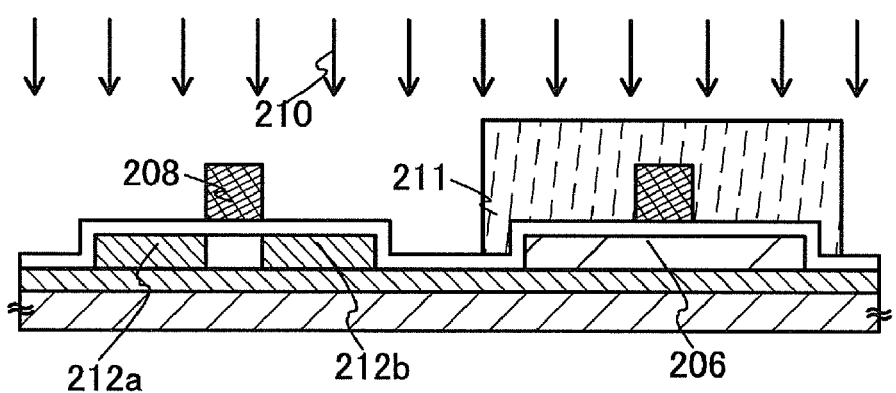
Figure 7E:
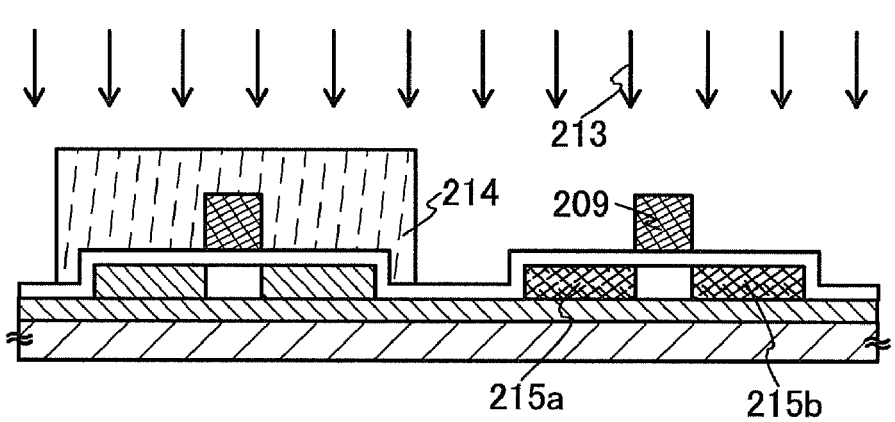

Then, an oxide film over the single crystal semiconductor layer is removed, and a gate insulating layer 207 which covers the single crystal semiconductor layers 205 and 206 is formed (see FIG. 7C). Since the single crystal semiconductor layers 205 and 206 in this embodiment have high planarity, even if a gate insulating layer formed over the single crystal semiconductor layers 205 and 206 is a thin gate insulating layer, the gate insulating layer can cover the single crystal semiconductor layers 205 and 206 with favorable coverage. Therefore, a characteristic defect due to a coverage defect of the gate insulating layer can be prevented, and a highly reliable semiconductor device can be manufactured with high yield. Reduction in thickness of the gate insulating layer 207 is effective in operating the thin film transistor with low voltage at high speed.

The gate insulating layer 207 may be formed of silicon oxide or a multilayer structure of silicon oxide and silicon nitride. The gate insulating layer 207 may be formed by deposition of an insulating film by a plasma CVD method or a low-pressure CVD method. Alternatively, the gate insulating layer may be formed by solid phase oxidation or solid phase nitridation with plasma treatment because a gate insulating layer formed by oxidation or nitridation of a single crystal semiconductor layer with plasma treatment is dense, has high withstand voltage and excellent reliability.

As the gate insulating layer 207, a high dielectric constant material such as zirconium dioxide, hafnium oxide, titanium dioxide, or tantalum pentoxide may be used. Use of a high dielectric constant material for the gate insulating layer 207 makes it possible to reduce gate leakage current.

A gate electrode layer 208 and a gate electrode layer 209 are formed over the gate insulating layer 207 (see FIG. 7C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material containing any of the above elements as its main component. Alternatively, as the gate electrode layers 208 and 209, a semiconductor layer typified by a polycrystalline silicon layer doped with an impurity element such as phosphorus, or an AgPdCu alloy may be used.

Then, a mask 211 which covers the single crystal semiconductor layer 206 is formed. Using the mask 211 and the gate electrode layer 208 as masks, an impurity element 210 imparting n-type conductivity is added to form first n-type impurity regions 212a and 212b (see FIG. 7D). In this embodiment, phosphine ($PH_3$) is used as a doping gas containing an impurity element. Here, doping is performed so that the first n-type impurity regions 212a and 212b contain an impurity element imparting n-type conductivity at a concentration of about $1\times10^{17}/cm^3$ to $5\times10^{18}/cm^3$. In this embodiment, phosphorus (P) is used as an impurity element imparting n-type conductivity.

Next, a mask 214 which covers the single crystal semiconductor layer 205 is formed. Using the mask 214 and the gate electrode layer 209 as masks, an impurity element 213 imparting p-type conductivity is added to form first p-type impurity regions 215a and 215b (see FIG. 7E). In this embodiment, boron (B) is used as an impurity element; thus, diborane ($B_2H_6$) or the like is used as a doping gas containing an impurity element.

Then, the mask 214 is removed. Sidewall insulating layers 216a to 216d with a sidewall structure are formed on side surfaces of the gate electrode layers 208 and 209, and gate insulating layers 233a and 233b are formed (see FIG. 8A). The sidewall insulating layers 216a to 216d with a sidewall structure may be formed on the side surfaces of the gate electrode layers 208 and 209 in a self-alignment manner as follows: an insulating layer covering the gate electrode layers 208 and 209 is formed and is processed by anisotropic etching using a reactive ion etching (RIE) method. Here, there is no particular limitation on the insulating layer and the insulating layer is preferably a layer of silicon oxide with favorable step coverage, which is formed by reaction of TEOS, silane, or the like with oxygen, nitrous oxide, or the like. The insulating layer can be formed by thermal CVD, plasma CVD, normal-pressure CVD, bias ECRCVD, sputtering or the like. The gate insulating layers 233a and 233b can be formed by etching the gate insulating layer 207 using the gate electrode layers 208 and 209 and the sidewall insulating layers 216a to 216d as masks.

In this embodiment, in etching the insulating layer, the insulating layer over the gate electrode layers are removed to expose the gate electrode layers. However, the sidewall insulating layers 216a to 216d may be formed to have a shape in which the insulating layer over the gate electrode layers remains. In addition, a protective film may be formed over the gate electrode layers in a later step. By protecting the gate electrode layers in this manner, film reduction of the gate electrode layers can be prevented when etching is conducted. Further, in the case of forming silicide in a source region and a drain region, since a metal film formed for formation of the silicide is not in contact with the gate electrode layers, even when a material of the metal film can easily react with a material of the gate electrode layer, defects such as chemical reaction or diffusion can be prevented. The etching method may be dry or wet, and can employ any of a variety of methods. In this embodiment, a dry etching method is used. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate.

Next, a mask 218 which covers the single crystal semiconductor layer 206 is formed. Using the mask 218, the gate electrode layer 208, and the sidewall insulating layers 216a and 216b as masks, an impurity element 217 imparting n-type conductivity is added to form second n-type impurity regions 219a and 219b and third n-type impurity regions 220a and 220b. In this embodiment, $PH_3$ is used as a doping gas containing an impurity element. Here, an impurity element imparting n-type conductivity is added so that the second n-type impurity regions 219a and 219b contain the impurity element imparting n-type conductivity at a concentration of about $5\times10^{19}/cm^3$ to $5\times10^{20}/cm^3$. In addition, a channel formation region 221 is formed in the single crystal semiconductor layer 205 (see FIG. 8B).

The second n-type impurity regions 219a and 219b are high-concentration n-type impurity regions and serve as a source and a drain. On the other hand, the third n-type impurity regions 220a and 220b are low-concentration impurity regions and serve as lightly doped drain (LDD) regions. Since the third n-type impurity regions 220a and 220b are formed in Loff regions, which are not covered with the gate electrode layer 208, an effect of reducing off current can be obtained. Accordingly, a semiconductor device with higher reliability and lower power consumption can be manufactured.

The mask 218 is removed, and a mask 223 which covers the single crystal semiconductor layer 205 is formed. Using the mask 223, the gate electrode layer 209, and the sidewall insulating layers 216c and 216d as masks, an impurity element 222 imparting p-type conductivity is added to form second p-type impurity regions 224a and 224b and third p-type impurity regions 225a and 225b.

An impurity element imparting p-type conductivity is added so that the second p-type impurity regions 224a and 224b contain the impurity element imparting p-type conductivity at a concentration of about $1\times10^{20}/cm^3$ to $5\times10^{21}/cm^3$. In this embodiment, the third p-type impurity regions 225a and 225b are formed in a self-alignment manner with the sidewall insulating layers 216c and 216d so as to have a lower concentration than the second p-type impurity regions 224a and 224b. In addition, a channel formation region 226 is formed in the single crystal semiconductor layer 206 (see FIG. 8C).

The second p-type impurity regions 224a and 224b are high-concentration p-type impurity regions and serve as a source and a drain. On the other hand, the third p-type impurity regions 225a and 225b are low-concentration impurity regions and serve as lightly doped drain (LDD) regions. Since the third p-type impurity regions 225a and 225b are formed in Loff regions, which are not covered with the gate electrode layer 209, an effect of reducing off current can be obtained. Accordingly, a semiconductor device with higher reliability and lower power consumption can be manufactured.

The mask 223 is removed, and heat treatment, irradiation with strong light, or irradiation with a laser beam may be performed in order to activate the impurity element. At the same time as the activation, plasma damage to the gate insulating layer and plasma damage to an interface between the gate insulating layer and the single crystal semiconductor layer can be repaired.

Next, an interlayer insulating layer which covers the gate electrode layers and the gate insulating layers is formed. In this embodiment, a multilayer structure of an insulating film 227 containing hydrogen to serve as a protective film and an insulating layer 228 is employed. The insulating film 227 and the insulating layer 228 may be a silicon nitride film, a silicon nitride oxide film, a silicon oxynitride film, or a silicon oxide film formed by a sputtering method or a plasma CVD method. Alternatively, a single layer structure or a multilayer structure of three or more layers using a different insulating film containing silicon may be employed.

Furthermore, a step in which heat treatment is performed at 300° C. to 550° C. for 1 to 12 hours in a nitrogen atmosphere to hydrogenate the single crystal semiconductor layers is performed. Preferably, the temperature is 400° C. to 500° C. This step is a step for terminating dangling bonds of the single crystal semiconductor layers by hydrogen contained in the insulating film 227, which is an interlayer insulating layer. In this embodiment, the heat treatment is performed at 410° C. for one hour.

The insulating film 227 and the insulating layer 228 can alternatively be formed of a material selected from aluminum nitride (AlN), aluminum oxynitride (AlON), aluminum nitride oxide which contains more nitrogen than oxygen (AlNO), aluminum oxide, diamond-like carbon (DLC), nitrogen-containing carbon (CN), or other substances containing an inorganic insulating material. A siloxane resin may also be used. The siloxane resin is a resin including an Si—O—Si bond. Siloxane has a skeletal structure formed of a bond of silicon (Si) and oxygen (O). As a substituent, an organic group (e.g., an alkyl group or an aryl group) or a fluoro group may be used. The organic group may include a fluoro group. Further, an organic insulating material such as polyimide, acrylic, polyamide, polyimide amide, resist, benzocyclobutene, or polysilazane can be used. A coating film with a favorable planarity formed by a coating method may be used.

The insulating film 227 and the insulating layer 228 can be formed with use of dipping, spray coating, a doctor knife, a roll coater, a curtain coater, a knife coater, a CVD method, an evaporation method, or the like. The insulating film 227 and the insulating layer 228 may alternatively be formed by a droplet discharging method. A droplet discharging method requires less material solution. Alternatively, a method capable of transferring or drawing a pattern similarly to a droplet discharging method, for example, a printing method (a method of forming a pattern, such as screen printing, offset printing, or the like) can be used.

Next, contact holes (openings) reaching the single crystal semiconductor layers are formed in the insulating film 227 and the insulating layer 228 using a mask formed of a resist. Etching may be conducted only once or a plurality of times depending on the etching selectivity between the materials which are used. The insulating film 227 and the insulating layer 228 are partly removed by the etching to form the openings reaching the second n-type impurity regions 219a and 219b and the second p-type impurity regions 224a and 224b, which are source regions and drain regions. The etching may be performed by wet etching, dry etching, or both wet etching and dry etching. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. Further, an inert gas may be added to an etching gas to be used. As an inert element to be added, one or a plurality of elements selected from He, Ne, Ar, Kr, or Xe can be used.

A conductive film is formed to cover the openings, and the conductive film is etched to form wiring layers 229a, 229b, 230a, and 230b which serve as source and drain electrode layers which are electrically connected to parts of source regions and drain regions. The wiring layers can be formed by forming a conductive film by a PVD method, a CVD method, an evaporation method, or the like, and then etching the conductive film into desired shapes. Alternatively, the wiring layers can be formed by forming conductive layers as selected in predetermined positions by a droplet discharging method, a printing method, an electroplating method, or the like. Further, a reflow method or a damascene method may be used. As a material for the wiring layers, metal such as Ag, Au, Cu, Ni, Pt, Pd, Ir, Rh, W, Al, Ta, Mo, Cd, Zn, Fe, Ti, Zr, or Ba; or Si or Ge; or an alloy or nitride thereof is used. Further, a multilayer structure of those layers may be employed.

Figure 8A:
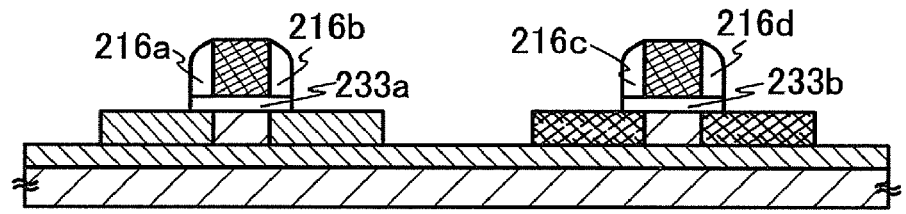
FIGS. 8A to 8D illustrate a method for manufacturing a semiconductor device of Embodiment 3.
Figure 8B:
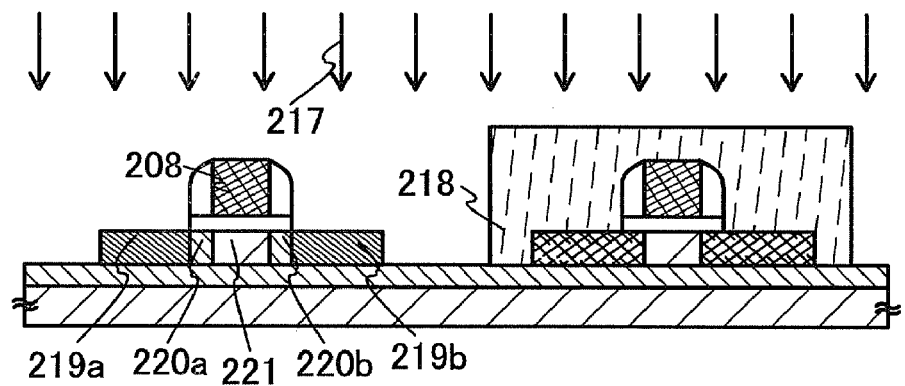
Figure 8C:
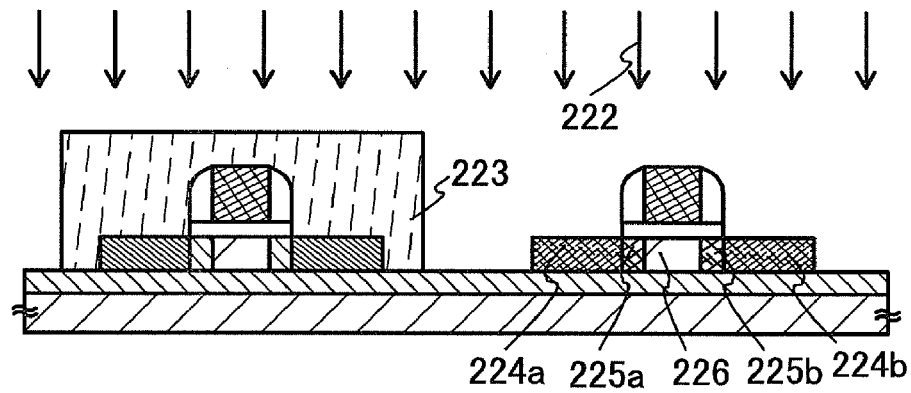
Figure 8D:
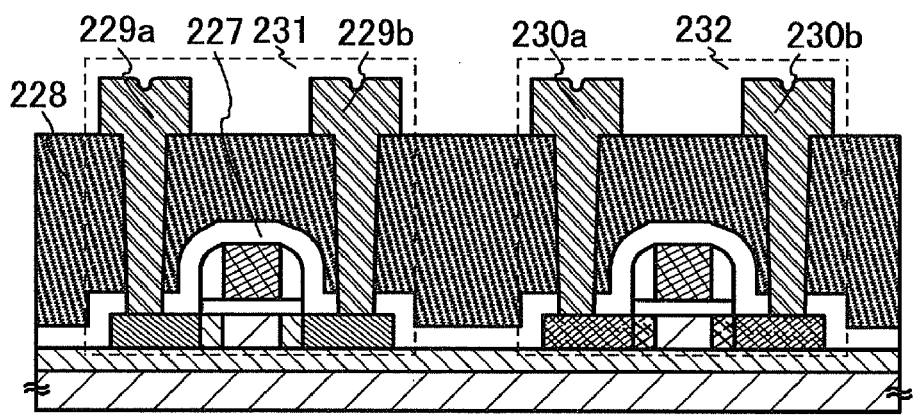

Through the above-described steps, a semiconductor device having a CMOS structure which includes a thin film transistor 231, which is an n-channel thin film transistor, and a thin film transistor 232, which is a p-channel thin film transistor, can be manufactured (see FIG. 8D). Although not shown in the drawings, since a CMOS structure is formed in this embodiment, the thin film transistor 231 and the thin film transistor 232 are electrically connected to each other.

The thin film transistor is not limited to the thin film transistor described in this embodiment, and may have a single gate structure with one channel formation region, a double gate structure with two channel formation regions, or a triple gate structure with three channel formation regions.

As described above, a high performance and highly reliable semiconductor device can be manufactured with high yield with use of an SOI substrate which has a single crystal semiconductor layer with reduced crystal defects and high planarity.

In this manner, thin film transistors can be manufactured using an SOI substrate. The single crystal semiconductor layer of the SOI substrate has almost no crystal defects and is a single crystal semiconductor layer with reduced interface state density with the gate insulating layer 207. The single crystal semiconductor layer has a planarized surface and has a reduced thickness of 50 nm or less. Accordingly, thin film transistors with excellent characteristics such as low driving voltage, high electron field effect mobility, and a low sub-threshold value can be formed using the SOI substrate. Furthermore, high performance transistors with little characteristic variation between the transistors can be formed over one substrate. In other words, with use of the SOI substrate according to the present invention, nonuniformity of the important characteristic value as transistor characteristics, such as threshold voltage or mobility, can be reduced and high performance such as high field effect mobility can be obtained.

Thus, a semiconductor device with high added value can be manufactured by forming various semiconductor elements such as TFTs using the SOI substrate according to the present invention.

Embodiment 4

Although a method of manufacturing TFTs is described in Embodiment 3, a semiconductor device with high added value can be manufactured by forming a variety of semiconductor elements such as a capacitor and a resistor together with the TFTs. Hereinafter, specific modes of semiconductor devices are described with reference to drawings.

Figure 9:
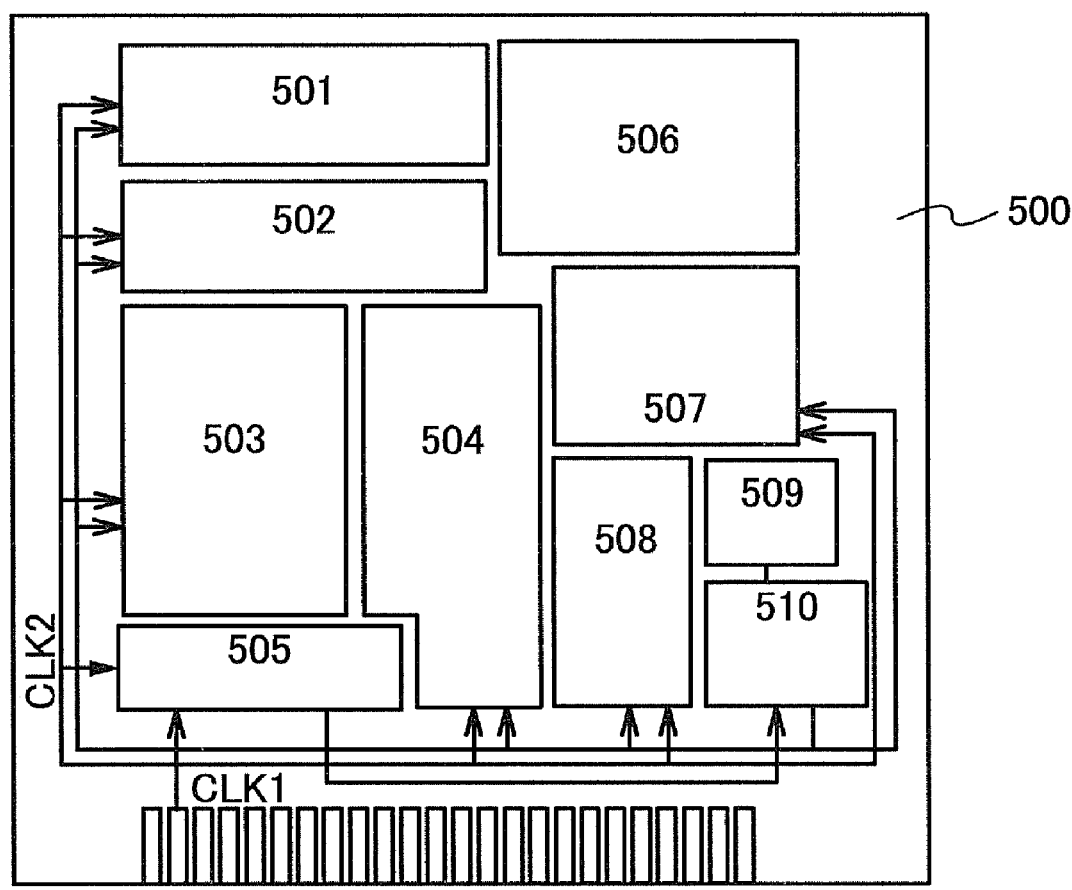
FIG. 9 is a block diagram illustrating a structure of a microprocessor obtained using an SOI substrate.

First, as an example of the semiconductor device, a microprocessor is described. FIG. 9 is a block diagram illustrating a structural example of a microprocessor 500. The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded, and then input to the ALU controller 502, the interrupt controller 504, the register controller 507, and the timing controller 505. The ALU controller 502, the interrupt controller 504, the register controller 507, and the timing controller 505 conduct variety of controls based on the decoded instruction.

Specifically, the ALU controller 502 generates signals for controlling operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 9, the internal clock signal CLK2 is input to other circuits.

Figure 10:
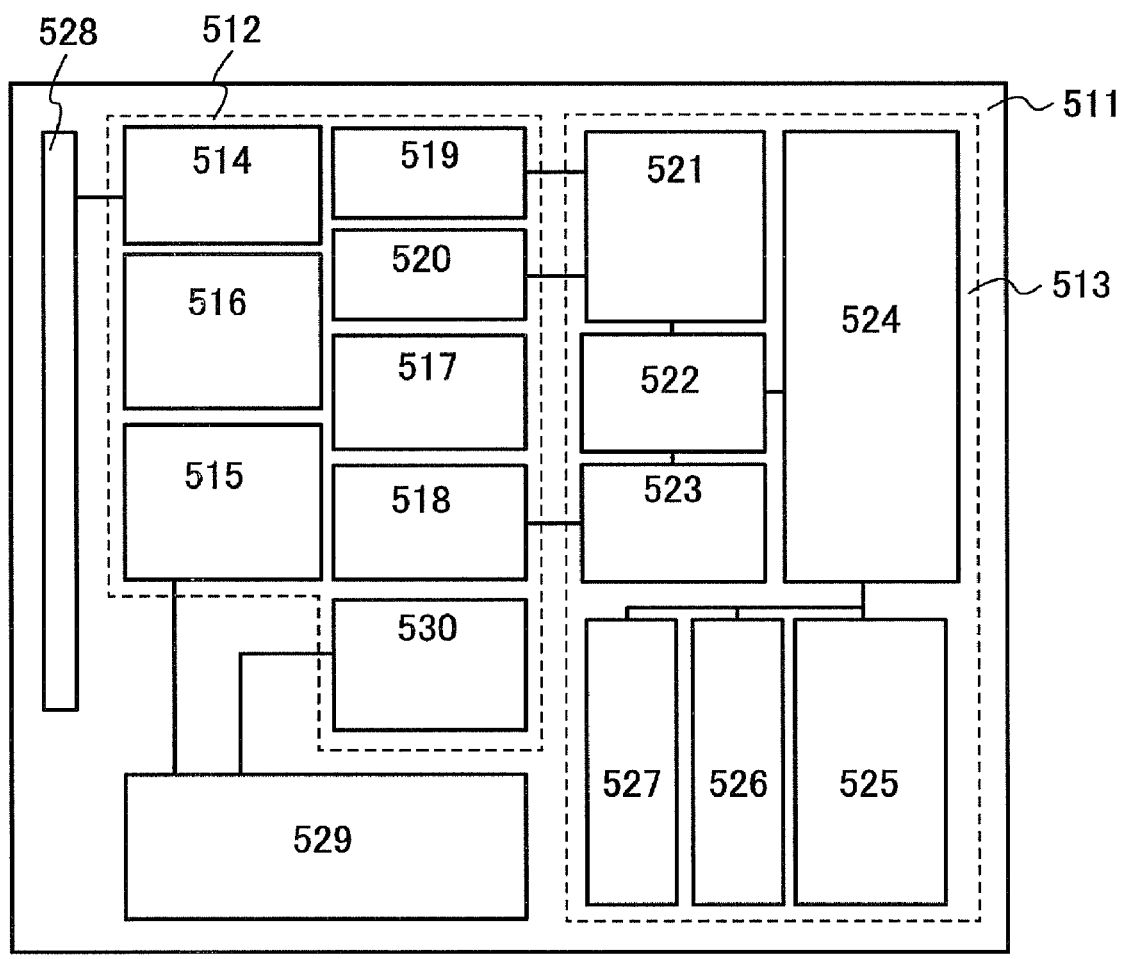
FIG. 10 is a block diagram of a structure of an RFCPU obtained using an SOI substrate.

Next, an example of a semiconductor device having a function of transmitting and receiving data without contact and also having an arithmetic function is described. FIG. 10 is a block diagram illustrating a structural example of a semiconductor device. The semiconductor device shown in FIG. 10 can be regarded as a computer (hereinafter also referred to as an "RFCPU") which operates to transmit and receive signals to and from an external device via wireless communication.

As shown in FIG. 10, an RFCPU 511 includes an analog circuit portion 512 and a digital circuit portion 513. The analog circuit portion 512 includes a resonance circuit 514 with a resonance capacitor, a rectifier circuit 515, a constant voltage circuit 516, a reset circuit 517, an oscillator circuit 518, a demodulator circuit 519, a modulator circuit 520, and a supply control circuit 530. The digital circuit portion 513 includes an RF interface 521, a control register 522, a clock controller 523, an interface 524, a central processing unit 525, a random access memory 526, and a read only memory 527.

The operation of the RFCPU 511 is as follows. The resonance circuit 514 generates an induced electromotive force based on a signal received by an antenna 528. The induced electromotive force is stored in a capacitor portion 529 through the rectifier circuit 515. This capacitor portion 529 is preferably formed using a capacitor such as a ceramic capacitor or an electric double layer capacitor. The capacitor portion 529 is not necessarily formed over the same substrate included in the RFCPU 511 and can be incorporated into the RFCPU 511 as another component.

The reset circuit 517 generates a signal for resetting and initializing the digital circuit portion 513. For example, the reset circuit 517 generates, as a reset signal, a signal that rises with delay after increase in the power supply voltage. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data that is to be transmitted.

For example, the demodulator circuit 519 is formed using a low-pass filter and binarizes a received signal of an amplitude shift keying (ASK) system based on the fluctuation of the received signal. The modulation circuit 520 transmits transmission data by changing the amplitude of a transmission signal of an amplitude shift keying (ASK) system. The modulation circuit 520 changes the resonance point of the resonance circuit 514, thereby changing the amplitude of a communication signal.

The clock controller 523 generates a control signal for changing the frequency and duty ratio of a clock signal in accordance with the power supply voltage or a consumption current of the central processing unit 525. The power supply voltage is managed by the power management circuit 530.

A signal input from the antenna 528 to the RFCPU 511 is demodulated by the demodulator circuit 519 and then decomposed into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal for any of the read only memory 527, the random access memory 526, and the control register 522 based on an address which is requested by the central processing unit 525.

As an arithmetic method of the central processing unit 525, a method may be employed in which the read only memory 527 stores an operating system (OS) and a program is read and executed at the time of starting operation. Alternatively, a method may be employed in which a circuit dedicated to arithmetic is formed as an arithmetic circuit and arithmetic processing is conducted using hardware. In a method in which both hardware and software are used, part of arithmetic processing can be conducted by a circuit dedicated to arithmetic, and the other part of the arithmetic processing can be conducted by the central processing unit 525 using a program.

In the RFCPU 511, an integrated circuit is formed using the single crystal semiconductor layer 112 with reduced crystal defects and a uniform crystal orientation; therefore, processing speed is increased and power consumption can be reduced. Accordingly, even when the capacitor portion 529 which supplies electric power is miniaturized, long-term operation is ensured.

Embodiment 5

Display devices using an SOI substrate according to the present invention will now be described with reference to FIGS. 11A and 11B and FIGS. 12A and 12B in this embodiment.

Figure 11A:
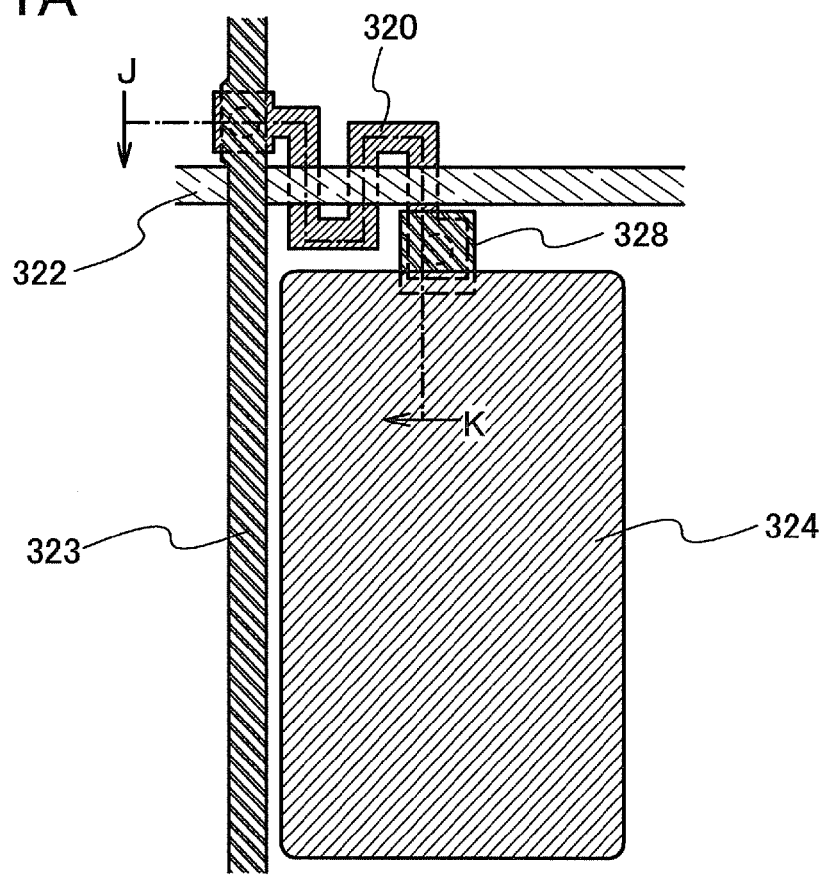
FIG. 11A is a plan view of a pixel of a liquid crystal display device and FIG. 11B is a cross-sectional view taken along line J-K of FIG. 11A.
Figure 11B:
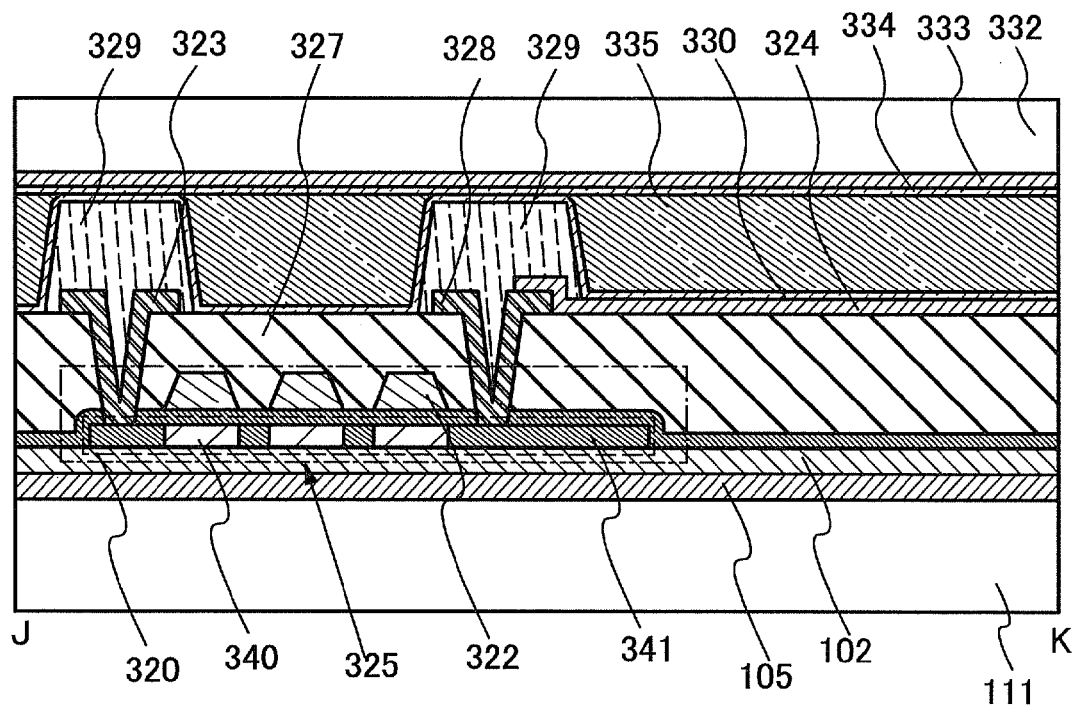

FIGS. 11A and 11B are drawings for describing a liquid crystal display device. FIG. 11A is a plane view of a pixel of the liquid crystal display device and FIG. 11B is a cross-sectional view taken along section line J-K in FIG. 11A.

As shown in FIG. 11A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 with the single crystal semiconductor layer 320. The single crystal semiconductor layer 320 is a layer formed of a single crystal semiconductor layer of an SOI substrate according to the present invention, in which planarization and reduction of crystal defects are achieved by the first etching treatment, second etching treatment, and following laser light irradiation. The single crystal semiconductor layer 320 is included in a TFT 325 of the pixel.

As the SOI substrate, the SOI substrate described in Embodiment 1 and Embodiment 2 is used. As illustrated in FIG. 11B, the single crystal semiconductor layer 320 is provided over the supporting substrate 111 with the insulating film 105 and the insulating film 102 interposed therebetween. As the supporting substrate 111, a glass substrate can be used. The single crystal semiconductor layer 320 of the TFT 325 is formed by etching a single crystal semiconductor layer of the SOI substrate for element isolation. A channel formation region 340 and n-type high-concentration impurity regions 341 to which impurity elements are added are formed in the single crystal semiconductor layer 320. A gate electrode of the TFT 325 is included in the scan line 322 and one of a source electrode and a drain electrode of the TFT 325 is included in the signal line 323.

The signal line 323, the pixel electrode 324, and the electrode 328 are provided over an interlayer insulating film 327. Over the interlayer insulating film 327, columnar spacers 329 are formed. An orientation film 330 is formed to cover the signal line 323, the pixel electrode 324, the electrode 328, and the columnar spacers 329. A counter substrate 332 is provided with a counter electrode 333 and an orientation film 334 which covers the counter electrode 333. The columnar spacers 329 are formed in order to maintain space between the supporting substrate 111 and the counter substrate 332. A liquid crystal layer 335 is formed in the space formed by the columnar spacers 329. The interlayer insulating film 327 has step at the connection portions between the n-type high-concentration impurity regions 341 and the signal line 323, and the n-type high-concentration impurity regions 341 and the electrode 328 due to formation of contact holes; therefore, orientation of liquid crystals in the liquid crystal layer 335 tends to be disordered at this connection portion. Therefore, the columnar spacers 329 are formed at these step portions to prevent disorder of liquid crystal orientation.

An SOI substrate which is formed by a method for manufacturing an SOI substrate according to the present invention has almost no crystal defects; therefore, high performance transistors with little characteristic variation between the transistors can be formed over one substrate. Accordingly, by manufacturing a liquid crystal display device using an SOI substrate according to the present invention, variation of characteristics between transistors can be small.

Figure 12A:
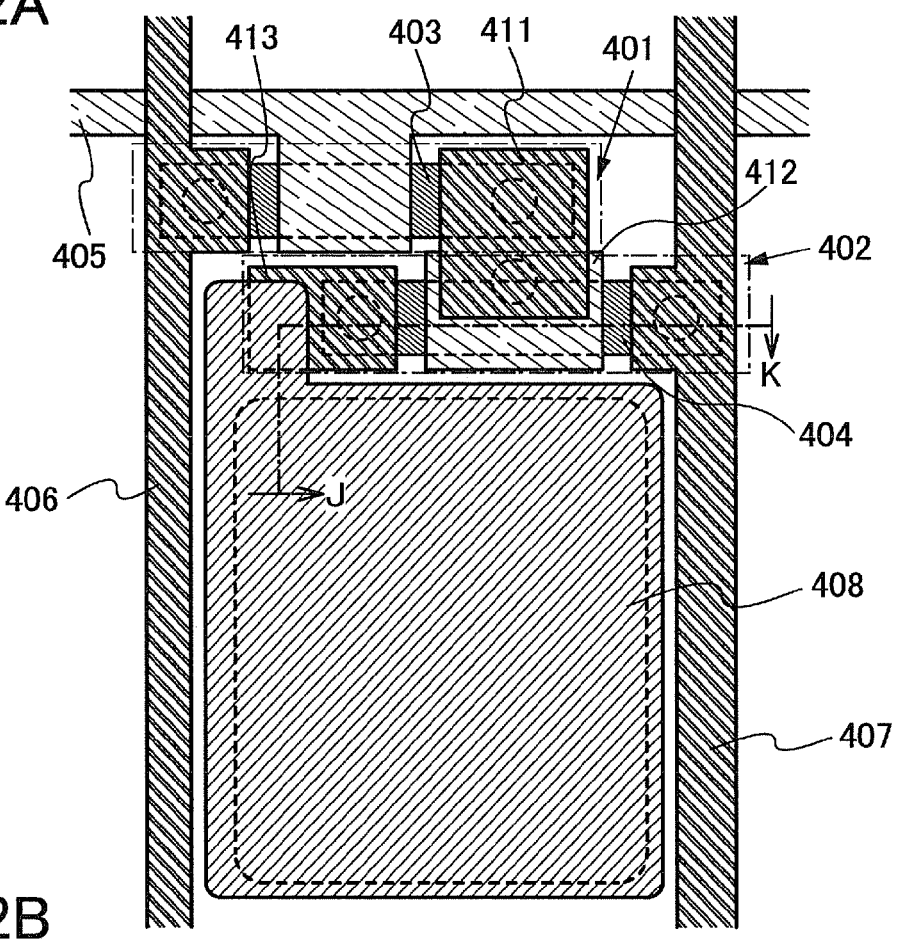
FIG. 12A is a plan view of a pixel of an electroluminescent display device and FIG. 12B is a cross-sectional view taken along line J-K of FIG. 12A.
Figure 12B:
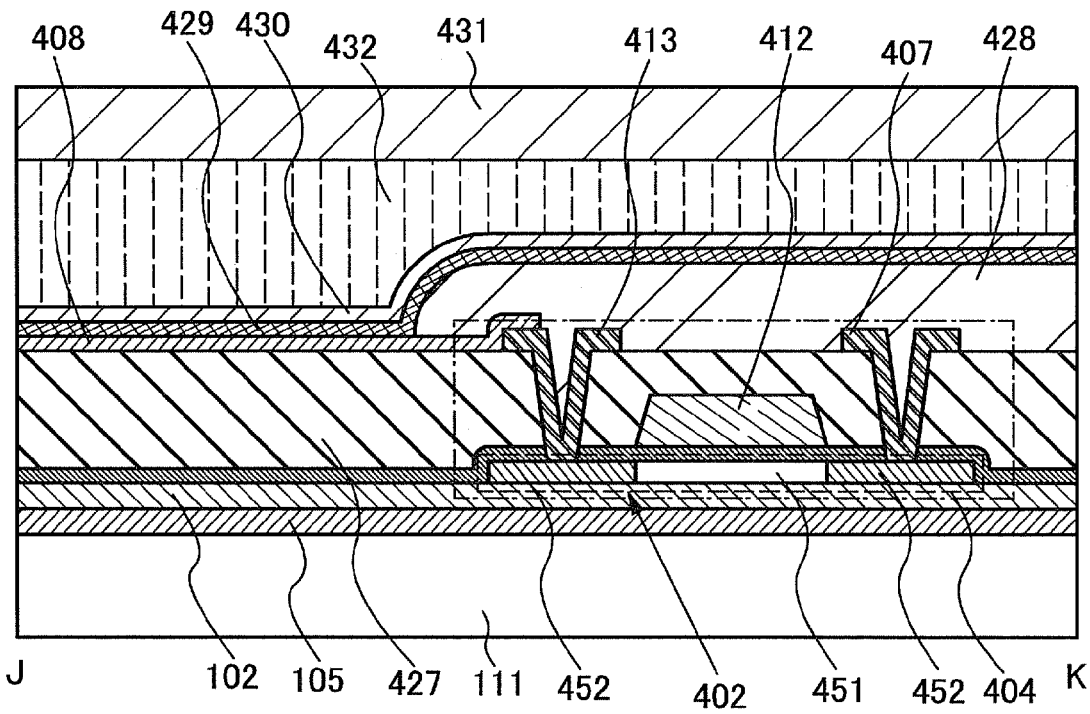

Next, an electroluminescent display device (hereinafter referred to as an EL display device) is described with reference to FIGS. 12A and 12B. FIG. 12A is a plane view of a pixel of the EL display device, and FIG. 12B is a cross-sectional view taken along section line J-K in FIG. 12A.

As illustrated in FIG. 12A, the pixel includes a switching transistor 401 and a display control transistor 402, which are transistors, a scan line 405, a signal line 406, a current supply line 407, and a pixel electrode 408. Each pixel is provided with a light-emitting element having a structure in which a layer including an electroluminescent material (an EL layer) is sandwiched between a pair of electrodes. One of the electrodes of the light-emitting element is the pixel electrode 408. Further, in a semiconductor film 403, a channel formation region, a source region, and a drain region of the switching transistor 401 are formed. Further, in a semiconductor film 404, a channel formation region, a source region, and a drain region of the display control transistor 402 are formed. The semiconductor films 403 and 404 are layers formed of the single crystal semiconductor layer 320 provided over the supporting substrate.

In the switching transistor 401, a gate electrode is included in the scan line 405, one of a source electrode and a drain electrode is included in the signal line 406, and the other one of the source electrode and the drain electrode is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other one of the source electrode and the drain electrode is included in the current supply line 407.

The display control transistor 402 is a p-channel TFT. As illustrated in FIG. 12B, a channel formation region 451 and a p-type high-concentration impurity region 452 are formed in the semiconductor film 404. Note that as an SOI substrate, the SOI substrate manufactured in Embodiments 1 and 2 is used.

An interlayer insulating film 427 is formed so as to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. The EL layer 429 is formed over the pixel electrode 408, and a counter electrode 430 is formed over the EL layer 429. A counter substrate 431 is provided as a reinforcing plate, and the counter substrate 431 is fixed to the supporting substrate 111 with a resin layer 432.

The gray scale of the EL display device can be controlled by a current driving method in which luminance of a light-emitting element is controlled by current or a voltage driving method in which luminance of a light-emitting element is controlled by voltage. In the case where there is a large difference in a characteristic value between transistors of pixels, it is difficult to employ the current driving method. In order to employ the current driving method, a correction circuit which corrects characteristic variation is needed. However, an SOI substrate which is formed by a method for manufacturing an SOI substrate according to the present invention has little crystal defects; therefore, high performance transistors with little characteristic variation between the transistors can be formed over one substrate. Accordingly, by manufacturing an EL display device using an SOI substrate according to the present invention, variation of characteristics of the switching transistor 401 and the display control transistor 402 between pixels is eliminated; therefore, the current driving method can be employed.

Embodiment 6

An SOI substrate according to the present invention is used for manufacturing a semiconductor device such as a transistor, and a variety of electronic devices can be manufactured using the semiconductor device. Since a single crystal semiconductor layer provided in an SOI substrate according to the present invention has reduced crystal defects, by using such a single crystal semiconductor layer as an active layer, a semiconductor element with improved electrical characteristics can be manufactured. In addition, since the single crystal semiconductor layer has reduced crystal defects, interface state density at an interface with a gate insulating layer can be reduced. Further, since the single crystal semiconductor layer has high planarity, a thin gate insulating layer having a high withstand voltage can be formed over the single crystal semiconductor layer; therefore, improvement in mobility, improvement in an S value, and suppression of a short channel effect of a semiconductor element manufactured can be achieved. In other words, by using an SOI substrate according to the present invention, a highly reliable semiconductor element with high current drive capability can be manufactured. As a result, electronic devices which are end products can be manufactured with high throughput and high quality. Various kinds of semiconductor devices can be manufactured using the semiconductor element. In this embodiment, specific examples are described with reference to some drawings. Note that in this embodiment, the same reference numerals denote the same parts as in above embodiments, and a detailed description is omitted.

Figure 13A:
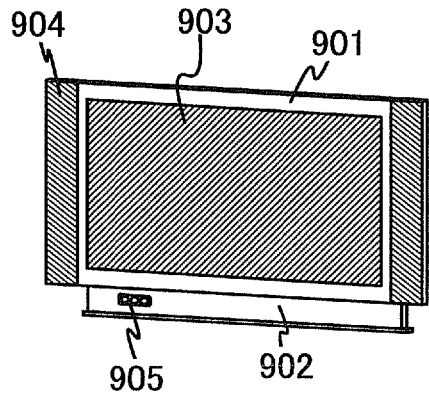
FIGS. 13A to 13F each illustrate an electronic device to which the present invention is applied.

FIG. 13A illustrates a display device which includes a chassis 901, a supporting base 902, a display portion 903, a speaker portion 904, a video input terminal 905, and the like. This display device is manufactured using the transistors formed by the manufacturing method described in another embodiment for a driver IC, the display portion 903, and the like. Note that the display device refers to a liquid crystal display device, a light-emitting display device, and the like, and all the information display devices for, for example, computers, television reception, and advertisement display can be included. Specifically, a display, a head-mounted display, a reflection type projector, and the like can be given.

Figure 13B:
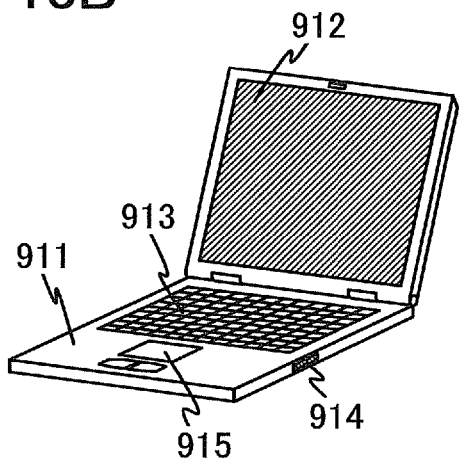

FIG. 13B illustrates a computer which includes a chassis 911, a display portion 912, a keyboard 913, an external connection port 914, a pointing device 915, and the like. A transistor formed according to the present invention can be applied not only to a pixel portion in the display portion 912 but also to a semiconductor device such as a driver IC for display, a CPU inside a main body, or a memory.

Figure 13C:
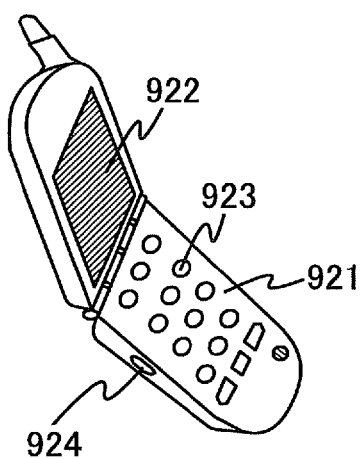

FIG. 13C illustrates a cellular phone, which is a typical example of a portable information processing terminals. This cellular phone includes a chassis 921, a display portion 922, an operation key 923, and the like. A transistor formed according to the present invention can be applied not only to a pixel portion in the display portion 922 or a sensor portion 924, but also to a driver IC for display, a memory, an audio processing circuit, and the like. The sensor portion 924 includes an optical sensor element, by which the luminance of the display portion 922 is controlled based on the luminance obtained by the sensor portion 924, and the brightness of the operation keys 923 is controlled based on the luminance obtained by the sensor portion 924. Thus, the power consumption of the cellular phone can be suppressed.

A semiconductor material formed according to the present invention can be used for electronic devices such as a PDA (a personal digital assistant or a portable information processing terminals), a digital camera, a compact game machine, or a portable audio playback device, in addition to the above cellular phone. For example, the semiconductor material of the present invention can be used for forming a functional circuit such as a CPU, a memory, or applied to a sensor or to a pixel portion or a driver IC for display of those electronic appliances.

Figure 13D:
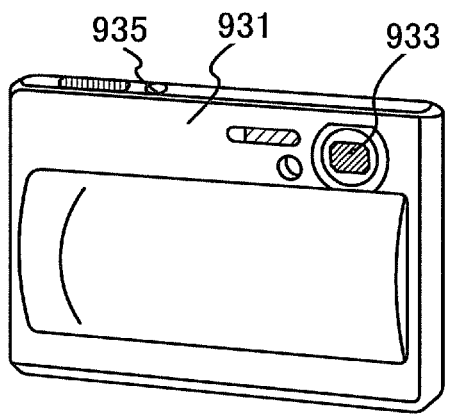
Figure 13E:
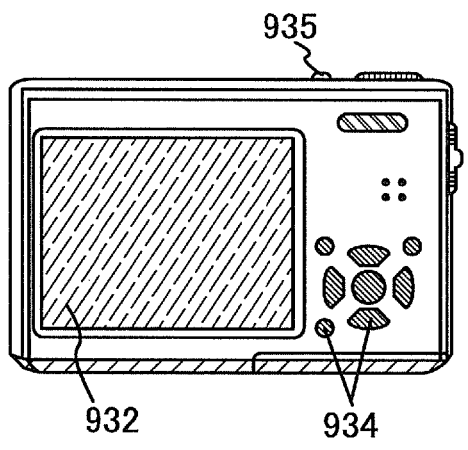

FIGS. 13D and 13E illustrate a digital camera. Note that FIG. 13E illustrates a rear side of the digital camera illustrated in FIG. 13D. This digital camera includes a chassis 931, a display portion 932, a lens 933, an operation key 934, a shutter button 935, and the like. A transistor formed according to the present invention can be applied to a pixel portion in the display portion 932, a driver IC for driving the display portion 932, a memory, and the like.

Figure 13F:
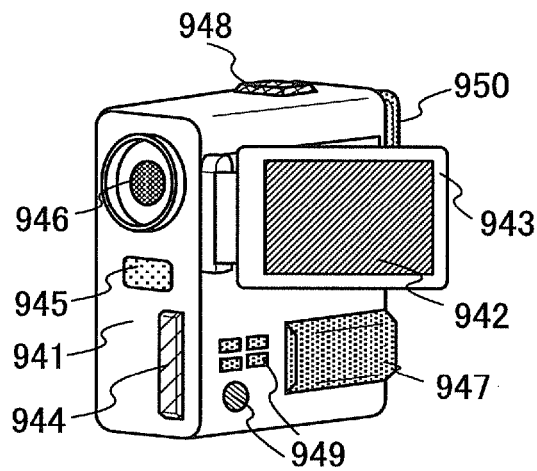

FIG. 13F illustrates a digital video camera. This digital video camera includes a main body 941, a display portion 942, a chassis 943, an external connection port 944, a remote control receiving portion 945, an image receiving portion 946, a battery 947, an audio input portion 948, an operation key 949, an eye piece portion 950, and the like. A transistor formed according to the present invention can be applied to a pixel portion in the display portion 942, a driver IC for driving the display portion 942, a memory, a digital input processing device, and the like.

Besides, the present invention can be applied to a navigation system, an audio playback device, an image reproducing device provided with a recording medium, and the like. A transistor manufactured according to the present invention can be applied to a pixel portion in a display portion, a driver IC for controlling the display portion, a memory, a digital input processing device, a sensor portion, and the like of those devices.

Figure 14A:
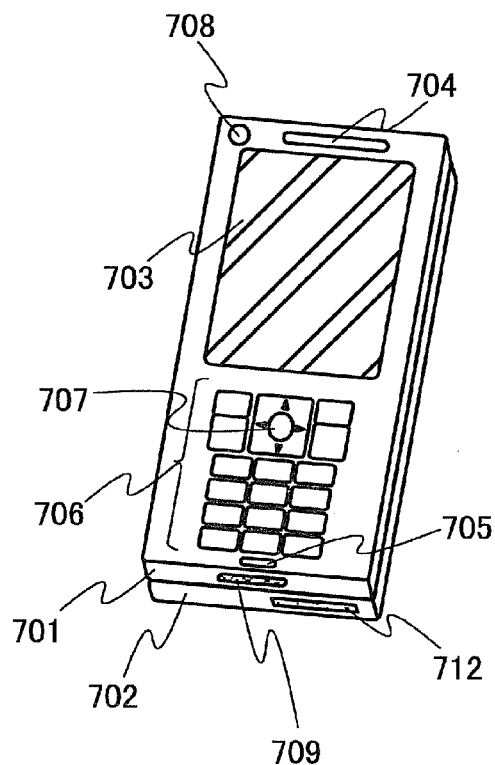
FIGS. 14A to 14C illustrate a cellular phone to which the present invention is applied.
Figure 14B:
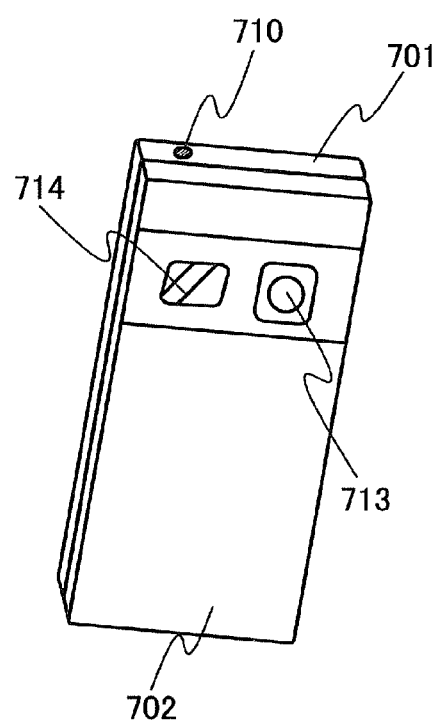
Figure 14C:
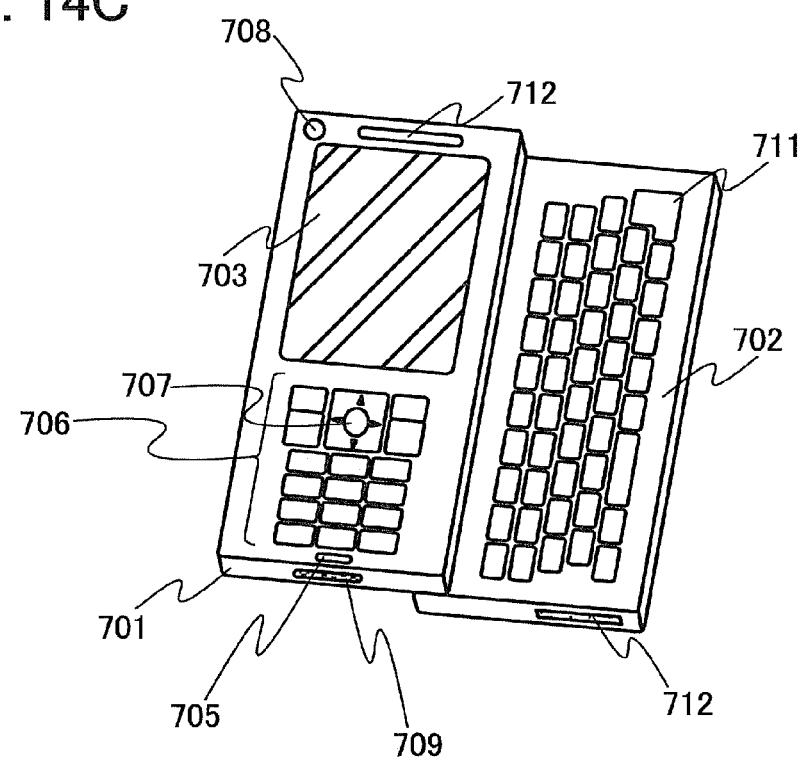

FIGS. 14A to 14C illustrate another example of a cellular phone to which the present invention is applied. FIG. 14A is a front view, and FIG. 14B is a rear view, and FIG. 14C is a front view in which two chassis are slid. The cellular phone 700 is a so-called smartphone that has both functions of a cellular phone and a portable information terminal and incorporates a computer and can process a variety of data processing in addition to voice calls.

The cellular phone 700 has a chassis 701 and a chassis 702. The chassis 701 includes a display portion 703, a speaker 704, a microphone 705, an operation key 706, a pointing device 707, a camera lens 708, an external connection terminal 709, an earphone terminal 710, and the like. The chassis 702 includes a keyboard 711, an external memory slot 712, a rear camera 713, a light 714, and the like. In addition, an antenna is incorporated in the chassis 701. A semiconductor element formed according to the present invention can be applied to a pixel portion in the display portion 703, a driver IC for driving the display portion 703, a memory, an audio processing circuit, and the like. Further, by applying the liquid crystal display device illustrated in FIGS. 11A and 11B or the EL display device illustrated in FIGS. 12A and 12B to the display portion 703, the display portion can have little display unevenness and excellent image quality.

Further, in addition to the above structure, the cellular phone 700 may incorporate a non-contact IC chip, a small memory device, or the like.

The chassis 701 and 702 which overlap with each other (see FIG. 14A) can be slid, and are slid to be developed as illustrated in FIG. 14C. Because the display portion 703 and the camera lens 708 are provided in the same plane, the smartphone can be used as a videophone. Further, a still image and a moving image can be taken with the rear camera 713 and the light 714 using the display portion 703 as a viewfinder.

With the use of the speaker 704 and the microphone 705, the cellular phone 700 can be used as an audio recording device (a recording device) or an audio playback device. Further, with the use of the operation keys 706, making and receiving calls, inputting simple information such as e-mails or the like, scrolling the screen displayed on the display portion, moving the cursor, e.g., for selecting information to be displayed on the display portion, and the like are possible.

If much information is needed to be treated, such as a case in which the smartphone is used for documentation or used as a portable information terminal, the use of the keyboard 711 is convenient. Further, the chassis 701 and the chassis 702 which overlap with each other (see FIG. 14A) can be slid to be developed as illustrated in FIG. 14C. In the case of using the smartphone as a portable information terminal, smooth operation can be conducted with the keyboard 711 and the pointing device 707. To the external connection terminal 709, an AC adaptor and various types of cables such as a USB cable can be connected, and charging and data communication with a personal computer or the like are possible. Further, a large amount of data can be stored and moved by inserting a recording medium into the external memory slot 712.

In the rear surface of the chassis 702 (see FIG. 14B), the rear camera 713 and the light 714 are provided, and a still image and a moving image can be taken using the display portion 703 as a viewfinder.

Further, the smartphone may have an infrared communication function, a USB port, a function of receiving one segment television broadcast, a non-contact IC chip, an earphone jack, or the like, in addition to the above-described functions and structures.

As described above, the range of application of the semiconductor device manufactured according to the present invention is very wide. The semiconductor device which is manufactured using the SOI substrate according to the present invention can be used for electronic devices in a variety of fields.

This application is based on Japanese Patent Application serial no. 2008-070474 filed with Japan Patent Office on Mar. 18, 2008, the entire contents of which are hereby incorporated by reference.

What is claimed is:

1. A method for manufacturing an SOI substrate comprising the steps of:
    forming an insulating film on a surface of a single crystal semiconductor substrate;
    forming a fragile region in the single crystal semiconductor substrate by irradiating the single crystal semiconductor substrate with an ion beam through the insulating film;
    forming a bonding layer over the insulating film;
    bonding a supporting substrate to the single crystal semiconductor substrate by interposing the bonding layer between the supporting substrate and the single crystal semiconductor substrate;
    dividing the single crystal semiconductor substrate at the fragile region to separate the single crystal semiconductor substrate into a single crystal semiconductor layer attached to the supporting substrate;
    performing a first dry etching treatment on a part of the fragile region remaining on the single crystal semiconductor layer, whereby a native oxide film is formed on a surface of the single crystal semiconductor layer;
    performing a second dry etching treatment to remove the native oxide film formed on the surface of the single crystal semiconductor layer; and
    irradiating the single crystal semiconductor layer with a laser light after the second dry etching treatment.

2. The method for manufacturing the SOI substrate according to claim 1, wherein the supporting substrate is a glass substrate.

3. The method for manufacturing the SOI substrate according to claim 1, wherein the surface of the single crystal semiconductor layer is melted and solidified by irradiating the single crystal semiconductor layer with the laser light.

4. The method for manufacturing the SOI substrate according to claim 1, wherein the surface of the single crystal semiconductor layer is planarized by irradiating the single crystal semiconductor layer with the laser light.

5. The method for manufacturing the SOI substrate according to claim 1,
    wherein after removing an oxide film formed on the single crystal semiconductor layer, the first dry etching treatment is performed for removing the fragile region remaining on the single crystal semiconductor layer from which the oxide film is removed.

6. The method for manufacturing the SOI substrate according to claim 1,
    wherein a thinning treatment is performed after irradiating the single crystal semiconductor layer with the laser light.

7. A method for manufacturing an SOI substrate comprising the steps of:
    forming an insulating film on a surface of a single crystal semiconductor substrate;
    forming a fragile region in the single crystal semiconductor substrate by irradiating the single crystal semiconductor substrate with an ion beam through the insulating film;
    forming a bonding layer over the insulating film;
    bonding a supporting substrate to the single crystal semiconductor substrate by interposing the bonding layer between the supporting substrate and the single crystal semiconductor substrate;
    dividing the single crystal semiconductor substrate at the fragile region to separate the single crystal semiconductor substrate into a single crystal semiconductor layer attached to the supporting substrate;
    removing a part of the fragile region remaining on the single crystal semiconductor layer by a first dry etching treatment, whereby a native oxide film is formed on a surface of the single crystal semiconductor layer;
    removing the native oxide film formed on the surface of the single crystal semiconductor layer by a second etching treatment; and
    irradiating the single crystal semiconductor layer with a laser light after the second etching treatment.

8. The method for manufacturing the SOI substrate according to claim 7, wherein the supporting substrate is a glass substrate.

9. The method for manufacturing the SOI substrate according to claim 7, wherein the surface of the single crystal semiconductor layer is melted and solidified by irradiating the single crystal semiconductor layer with the laser light.

10. The method for manufacturing the SOI substrate according to claim 7, wherein the surface of the single crystal semiconductor layer is planarized by irradiating the single crystal semiconductor layer with the laser light.

11. The method for manufacturing the SOI substrate according to claim 7,
    wherein a thinning treatment is performed after irradiating the single crystal semiconductor layer with the laser light.

* * * * *